United States Patent
Hirai et al.

(10) Patent No.: US 10,611,151 B2
(45) Date of Patent: Apr. 7, 2020

(54) LIQUID EJECTING HEAD, LIQUID EJECTING APPARATUS, AND PIEZOELECTRIC DEVICE

(71) Applicant: SEIKO EPSON CORPORATION, Tokyo (JP)

(72) Inventors: Eiju Hirai, Azumino (JP); Motoki Takabe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/129,572

(22) Filed: Sep. 12, 2018

(65) Prior Publication Data

US 2019/0077151 A1    Mar. 14, 2019

(30) Foreign Application Priority Data

Sep. 13, 2017   (JP) ................. 2017-175481

(51) Int. Cl.
| | |
|---|---|
| *B41J 2/14* | (2006.01) |
| *B41J 2/16* | (2006.01) |
| *H01L 41/09* | (2006.01) |
| *H01L 41/047* | (2006.01) |

(52) U.S. Cl.
CPC ......... *B41J 2/14233* (2013.01); *B41J 2/1433* (2013.01); *B41J 2/161* (2013.01); *B41J 2/1628* (2013.01); *B41J 2/1629* (2013.01); *H01L 41/0973* (2013.01); *B41J 2002/14491* (2013.01); *H01L 41/0475* (2013.01)

(58) Field of Classification Search
CPC ...... B41J 2/14233; B41J 2/161; B41J 2/1628; B41J 2/1629; B41J 2/1433; B41J 2002/14491; H01L 41/0475
See application file for complete search history.

(56) References Cited

U.S. PATENT DOCUMENTS 9,144,972 B2 * 9/2015 Furuya ................ B41J 2/14201

FOREIGN PATENT DOCUMENTS

| JP | 2017-24334 A | 7/2015 |
|---|---|---|
| JP | 2016-62984 A | 4/2016 |

OTHER PUBLICATIONS

IP.com search (Year: 2019).*

* cited by examiner

*Primary Examiner* — Lisa Solomon
(74) *Attorney, Agent, or Firm* — Workman Nydegger

(57) ABSTRACT

There is provided a liquid ejecting head including: a flow path forming substrate in which a plurality of pressure generation chambers are arranged in parallel in a first direction; and a piezoelectric actuator which has a first electrode provided on one surface side of the flow path forming substrate with a vibration plate interposed therebetween, a piezoelectric layer provided on the first electrode, and a second electrode provided on the piezoelectric layer, in which, in the piezoelectric actuator, an active portion which is obtained by inserting the first electrode and the second electrode of the piezoelectric layer is provided, between the active portions adjacent to each other in the first direction, a groove portion is provided which is provided over the second electrode, the piezoelectric layer, the first electrode, and a portion of the vibration plate in a stacked direction.

19 Claims, 15 Drawing Sheets

LIQUID EJECTING HEAD, LIQUID EJECTING APPARATUS, AND PIEZOELECTRIC DEVICE

The entire disclosure of Japanese Patent Application No. 2017-175481, filed Sep. 13, 2017 is expressly incorporated by reference herein.

BACKGROUND

1. Technical Field

The present invention relates to a liquid ejecting head, a liquid ejecting apparatus, and a piezoelectric device that eject a liquid from a nozzle, and particularly to an ink jet type recording head, an ink jet type recording apparatus, and a piezoelectric device that eject ink as a liquid.

2. Related Art

As an ink jet type recording head which is a typical example of a liquid ejecting head, there is an ink jet type recording head which includes a flow path forming substrate provided with a pressure generation chamber communicating with a nozzle, and a piezoelectric actuator having a first electrode, a piezoelectric layer, and a second electrode that are provided with a vibration plate interposed therebetween on a surface side of the flow path forming substrate, and emits ink droplets from the nozzle by generating pressure change in a pressure generation chamber by displacement of the piezoelectric actuator.

In addition, in a piezoelectric actuator, a configuration is disclosed in which a first electrode is used as a common electrode common to a plurality of active portions and a second electrode is formed as a separate individual electrode for each active portion (see, for example, JP-A-2016-62984).

In JP-A-2016-62984, an end portion of the active portion interposed between a first electrode and a second electrode is defined by a first electrode, and the end portion of the active portion is disposed at a position inside the pressure generation chamber.

However, in a case where the first electrode is used as a common electrode, there is a problem that since the first electrode functions as a portion of a vibration plate and the film thickness of a so-called arm portion between the vibration plate and a partition wall forming a pressure generation chamber as an outside of the active portion, the displacement of the active portion is hindered by the arm portion having a thick film thickness.

If the film thickness of the vibration plate merely decreases, there is a problem that the neutral axis position of the active portion shifts and the displacement characteristic of the active portion cannot be obtained. In other words, when the vibration plate is formed with the film thickness that optimizes the neutral axis position of the active portion, the rigidity of the arm portion of the vibration plate becomes too high to be displaced.

Such a problem is not limited to a liquid ejecting head typified by an ink jet type recording head but exists in other piezoelectric devices as well.

SUMMARY

An advantage of some aspects of the invention is to provide a liquid ejecting head, a liquid ejecting apparatus, and a piezoelectric device that can improving the displacement of a piezoelectric actuator.

According to an aspect of the invention, there is provided a liquid ejecting head including: a flow path forming substrate in which a plurality of pressure generation chambers communicating with nozzles are arranged in parallel in a first direction; and a piezoelectric actuator which has a first electrode provided on one surface side of the flow path forming substrate with a vibration plate interposed therebetween, a piezoelectric layer provided on the first electrode, and a second electrode provided on the piezoelectric layer, in which, in the piezoelectric actuator, an active portion which is obtained by inserting the first electrode and the second electrode of the piezoelectric layer is provided for each pressure generation chamber, the first electrode constitutes common electrodes which are provided commonly to a plurality of the active portions, the second electrode constitutes an individual electrode independently provided for each of the active portions, in a second direction orthogonal to the first direction as an in-plane direction of the one surface of the flow path forming substrate, an end portion of the first electrode is provided outside an end portion of the second electrode, an end portion of the piezoelectric layer is provided between the end portion of the first electrode and the end portion of the second electrode, in the second direction, a leading-out wiring leaded out in the second direction from one end portion of the second electrode is provided, between the active portions adjacent to each other in the first direction, a groove portion is provided which is provided over the second electrode, the piezoelectric layer, the first electrode, and a portion of the vibration plate in a stacked direction, and in the second direction, the end portion of the groove portion is positioned inside an end portion of the leading-out wiring.

In this case, by providing the groove portion reaching the vibration plate between the active portions, it is possible to reduce the rigidity of a region, the so-called arm portion, facing the pressure generation chamber outside the active portion of the vibration plate without changing the configuration of the vibration plate immediately below the active portion. Therefore, it is possible to improve the displacement characteristics of the piezoelectric actuator, that is, to obtain a large displacement amount with a low drive voltage.

In addition, in the second direction, by disposing the end portion of the groove portion inside the end portion of the leading-out wiring, since the boundary of the groove portion is disposed in a portion where the stacked structure of the vibration plate, the piezoelectric actuator, and the leading-out wiring does not change, it is possible to gradually change the rigidity of the piezoelectric actuator in the second direction and it is possible to suppress the stress concentration when the piezoelectric actuator is displaced and to suppress the breakage thereof.

In addition, in the second direction, by disposing the end portion of the groove portion inside the end portion of the leading-out wiring, the first electrode is not divided for each active portion outside the groove portion, the first electrode can be made continuous in the first direction, and the first electrode can be used as a common electrode of the plurality of active portions. In addition, in the second direction Y, since the first electrode can be left wide outside the groove portion, the electric resistance of the first electrode is lowered so that the voltage drop in the first direction X of the first electrode is suppressed and thus it is possible to suppress occurrence of variations in the displacement amount of the active portion.

In addition, according to another aspect of the invention, there is provided a liquid ejecting head including: a flow path forming substrate in which a plurality of pressure generation chambers communicating with nozzles are arranged in parallel in a first direction; and a piezoelectric actuator which has a first electrode provided on one surface side of the flow path forming substrate with a vibration plate interposed therebetween, a piezoelectric layer provided on the first electrode, and a second electrode provided on the piezoelectric layer, in which, in the piezoelectric actuator, an active portion which is obtained by inserting the first electrode and the second electrode of the piezoelectric layer is provided for each pressure generation chamber, the first electrode constitutes common electrodes which are provided commonly to a plurality of the active portions, the second electrode constitutes an individual electrode independently provided for each of the active portions, in a second direction orthogonal to the first direction as an in-plane direction of the one surface of the flow path forming substrate, an end portion of the first electrode is provided outside an end portion of the second electrode, and an end portion of the piezoelectric layer is provided between the end portion of the first electrode and the end portion of the second electrode, in the second direction, a leading-out wiring leaded out from one end portion of the second electrode in the second direction is provided, between the active portions adjacent to each other in the first direction, a groove portion is provided which is provided over the second electrode, the piezoelectric layer, the first electrode, and a portion of the vibration plate in a stacked direction, and in the second direction, the end portion of the groove portion is positioned outside an end portion of the active portion.

In this case, by providing the groove portion reaching the vibration plate between the active portions, it is possible to reduce the rigidity of a region, the so-called arm portion, facing the pressure generation chamber outside the active portion of the vibration plate without changing the configuration of the vibration plate immediately below the active portion. Therefore, it is possible to improve the displacement characteristics of the piezoelectric actuator, that is, to obtain a large displacement amount with a low drive voltage.

In addition, in the second direction, by disposing the end portion of the groove portion outside the end portion of the active portion, it is possible to dispose a boundary between a high-rigidity portion on which the groove portion is not formed and a low-rigidity portion on which the groove portion is formed at a region in which the effective electric field is low outside the active portion of the piezoelectric actuator. Therefore, it is difficult to deform the boundary in which the rigidity changes to be large according to the presence or absence of the groove portion and thus it is possible to suppress the stress concentration on the boundary and suppress the breakage thereof.

Here, in the second direction, it is preferable that the end portion of the groove portion be positioned inside the end portion of the first electrode. According to this, by disposing the end portion of the groove portion inside the end portion of the first electrode, the first electrode is not divided for each active portion outside the groove portion, so that the first electrode can be continuous over the first direction and used as a common electrode.

In addition, it is preferable that, in the second direction, the end portion of the groove portion be positioned inside the end portion of the piezoelectric layer. According to this, by disposing the end portion of the groove portion inside the piezoelectric layer, the first electrode is not divided for each active portion outside the groove portion, so that the first electrode can be continuous over the first direction and used as a common electrode. In addition, by disposing the end portion of the groove portion inside the end portion of the piezoelectric layer, it is possible to leave the first electrode wide outside the groove portion, so that the electric resistance of the first electrode is lowered and it is possible to suppress the voltage drop in the first direction of the first electrode and suppress the variation in the displacement amount of the active portion.

In addition, it is preferable that, in the second direction, the end portion of the groove portion be positioned outside the end portion of the pressure generation chamber. According to this, by providing the boundary where the rigidity greatly changes according to the presence or absence of the groove portion in the non-flexible portion that is not displaced outside the pressure generation chamber of the piezoelectric actuator, concentration of the stress on the end portion of the groove portion is suppressed and thus breakage thereof can be suppressed.

In addition, in the second direction, it is preferable that a dummy leading-out wiring be provided which is connected to the other end portion of the second electrode on a side opposite to the one end portion to which the leading-out wiring is connected, and be leaded out in the second direction. According to this, by providing the dummy leading-out wiring, the electric field strength and the rigidity of the both end portions of the piezoelectric actuator in the second direction are equalized so that the electric characteristic and the structural characteristic of the piezoelectric actuator are symmetrical in the second direction. Therefore, when the piezoelectric actuator is displaced, the excessive deformation of only the one end portion can be suppressed and thus breakage thereof can be suppressed.

In addition, in the second direction, it is preferable that a dummy leading-out wiring be provided which is connected to the other end portion of the second electrode on a side opposite to the one end portion to which the leading-out wiring is connected, and be leaded out in the second direction, and in the second direction, and an end portion of the groove portion on the side of the dummy leading-out wiring be positioned inside the end portion of the dummy leading-out wiring. According to this, by providing the dummy leading-out wiring, the electric field strength and the rigidity of the both end portions of the piezoelectric actuator in the second direction are equalized so that the electric characteristic and the structural characteristic of the piezoelectric actuator are symmetrical in the second direction. Therefore, when the piezoelectric actuator is displaced, excessive deformation of only the one end portion can be suppressed and breakage thereof can be suppressed. In addition, by disposing the end portion of the groove portion inside the end portion of the dummy leading-out wiring, it is possible to gradually change the rigidity also on a side of the dummy leading-out wiring to suppress the breakage of the piezoelectric actuator due to stress concentration.

In addition, in the second direction, it is preferable that the leading-out wiring leaded out from the first electrode be provided on a side opposite to the active portion of the dummy leading-out wiring. According to this, by providing the leading-out wiring, it is possible to easily lead out the wiring from the first electrode. In addition, by providing the leading-out wirings leaded out from the first electrode continuously in the first direction, it is possible to lower the electric resistance in the first direction of the first electrode.

In addition, in the first direction, it is preferable that an end portion of the groove portion at least on a side of the flow path forming substrate in the stacked direction be provided inside the pressure generation chamber of an end portion of the pressure generation chamber on a side of the vibration plate. According to this, by providing the groove portions, the rigidity of the region, the so-called arm portion, facing the pressure generation chamber outside the active portion of the vibration plate is lowered without changing the configuration of the vibration plate immediately below the active portion and the displacement characteristics of the piezoelectric actuator can be improved.

In addition, it is preferable that an end portion of the pressure generation chamber in the second direction be positioned between the piezoelectric layer and the second electrode. According to this, it is possible to improve the rigidity of the boundary between the flexible portion and the non-flexible portion of the vibration plate, and to suppress breakage due to stress collection at the boundary.

In addition, it is preferable that the vibration plate be configured by stacking materials different in an etching selection ratio in the stacked direction of the flow path forming substrate and the piezoelectric actuator, and a bottom surface of the groove portion is a layer boundary of the vibration plate. According to this, the groove portion can be easily formed by etching and the depth can be formed with high accuracy.

In addition, on an inner surface of the groove portion, an end surface of the piezoelectric layer, an end surface of the first electrode, and an end surface of the vibration plate from which a portion in the stacked direction is removed are provided so as to be flush one another. According to this, when the groove portion is formed, the piezoelectric layer, the first electrode, and a portion of the vibration plate in the stacked direction are collectively etched to form the end surface of the piezoelectric layer, which is the inner surface of the groove portion, the end surface of the first electrode, and the end surface of the removed portion of the vibration plate can be positioned with high accuracy and the groove portion can be formed with high accuracy.

In addition, on an inner surface of the groove portion a step may be formed between an end surface of the piezoelectric layer, an end surface of the first electrode, and an end surface of the vibration plate from which a portion in the stacked direction is removed.

Further, according to still another aspect of the invention, there is provided a liquid ejecting apparatus including the liquid ejecting head described above.

In this case, it is possible to realize a liquid ejecting apparatus in which the displacement of the piezoelectric actuator is improved.

In addition, according to still another aspect of the invention, there is provided a piezoelectric device including: a substrate in which a plurality of recessed portions are arranged in parallel in a first direction; and a piezoelectric actuator which has a first electrode provided on one surface side of the substrate with a vibration plate interposed therebetween, an piezoelectric layer provided on the first electrode, and a second electrode provided on the piezoelectric layer, in which, in the piezoelectric actuator, an active portion obtained by inserting the first electrode and the second electrode of the piezoelectric layer is provided for each recessed portion, the first electrode constitutes common electrodes which are provided commonly to a plurality of the active portions, the second electrode constitutes an individual electrode independently provided for each of the active portions, in a second direction orthogonal to the first direction as an in-plane direction of the one surface of the substrate, an end portion of the first electrode is provided outside an end portion of the second electrode, an end portion of the piezoelectric layer is provided between the end portion of the first electrode and the end portion of the second electrode, in the second direction, a leading-out wiring leaded out in the second direction from one end portion of second electrode is provided, between the active portions adjacent to each other in the first direction, a groove portion provided over the second electrode, the piezoelectric layer, the first electrode, and a portion of the vibration plate in the stacked direction is provided, and in the second direction, an end portion of the groove portion is positioned inside an end portion of the leading-out wiring.

In this case, by providing the groove portion reaching the vibration plate between the active portions, without changing a configuration of the vibration plate immediately under the active portion, the rigidity of a region, a so-called arm portion, facing the recessed portion outside the active portion of the vibration plate can be reduced. Therefore, it is possible to improve the displacement characteristics of the piezoelectric actuator, that is, to obtain a large displacement amount with a low drive voltage.

In addition, in the second direction, by disposing the end portion of the groove portion inside the end portion of the leading-out wiring, since the boundary of the groove portion is disposed in a portion where the stacked structure of the vibration plate, the piezoelectric actuator, and the leading-out wiring is not changed, it is possible to gradually change the rigidity of the piezoelectric actuator in the second direction and it is possible to suppress the stress concentration when the piezoelectric actuator is displaced and to suppress the breakage.

In addition, in the second direction, by disposing the end portion of the groove portion inside the end portion of the leading-out wiring, the first electrode is not divided for each active portion outside the groove portion, the first electrode can be made continuous over the first direction, and the first electrode can be used as a common electrode of a plurality of active portions. In addition, in the second direction Y, since the first electrode can be left wide outside the groove portion, the electric resistance of the first electrode is lowered so that the voltage drop of the first electrode in the first direction X and it is possible to suppress occurrence of variations in the displacement amount of the active portion.

Further, according to still another aspect of the invention, there is provided a piezoelectric device including: a substrate in which a plurality of recessed portions are arranged in parallel in a first direction; and a piezoelectric actuator which has a first electrode provided on one surface side of the substrate with a vibration plate interposed therebetween, an piezoelectric layer provided on the first electrode, and a second electrode provided on the piezoelectric layer, in which, in the piezoelectric actuator, an active portion obtained by inserting the first electrode and the second electrode of the piezoelectric layer is provided for each recessed portion, the first electrode constitutes common electrodes which are provided commonly to a plurality of the active portions, the second electrode constitutes an individual electrode independently provided for each of the active portions, in a second direction orthogonal to the first direction as an in-plane direction of the one surface of the substrate, an end portion of the first electrode is provided outside an end portion of the second electrode, and an end portion of the piezoelectric layer is provided between the end portion of the first electrode and the end portion of the second electrode, in the second direction, a leading-out wiring leaded out in the second direction from one end portion of second electrode is provided, between the active portions adjacent to each other in the first direction, a groove portion provided over the second electrode, the piezoelectric layer, the first electrode, and a portion of the vibration plate in the stacked direction is provided, and in the second direction, an end portion of the groove portion is positioned outside an end portion of the active portion.

In this case, by providing the groove portion reaching the vibration plate between the active portions, without changing a configuration of the vibration plate immediately under the active portion, the rigidity of a region, a so-called arm portion, facing the recessed portion outside the active portion of the vibration plate can be reduced. Therefore, it is possible to improve the displacement characteristics of the piezoelectric actuator, that is, to obtain a large displacement amount with a low drive voltage.

In addition, in the second direction, by disposing the end portion of the groove portion outside the end portion of the active portion, it is possible to dispose a boundary between a high-rigidity portion on which the groove portion is not formed and a low-rigidity portion on which the groove portion is formed at a region in which the effective electric field is low outside the active portion of the piezoelectric actuator. Therefore, it is difficult to deform the boundary in which the rigidity changes to be large according to the presence or absence of the groove portion and thus it is possible to suppress the stress concentration on the boundary and suppress the breakage thereof.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail based on embodiments.

Embodiment 1

Figure 1:
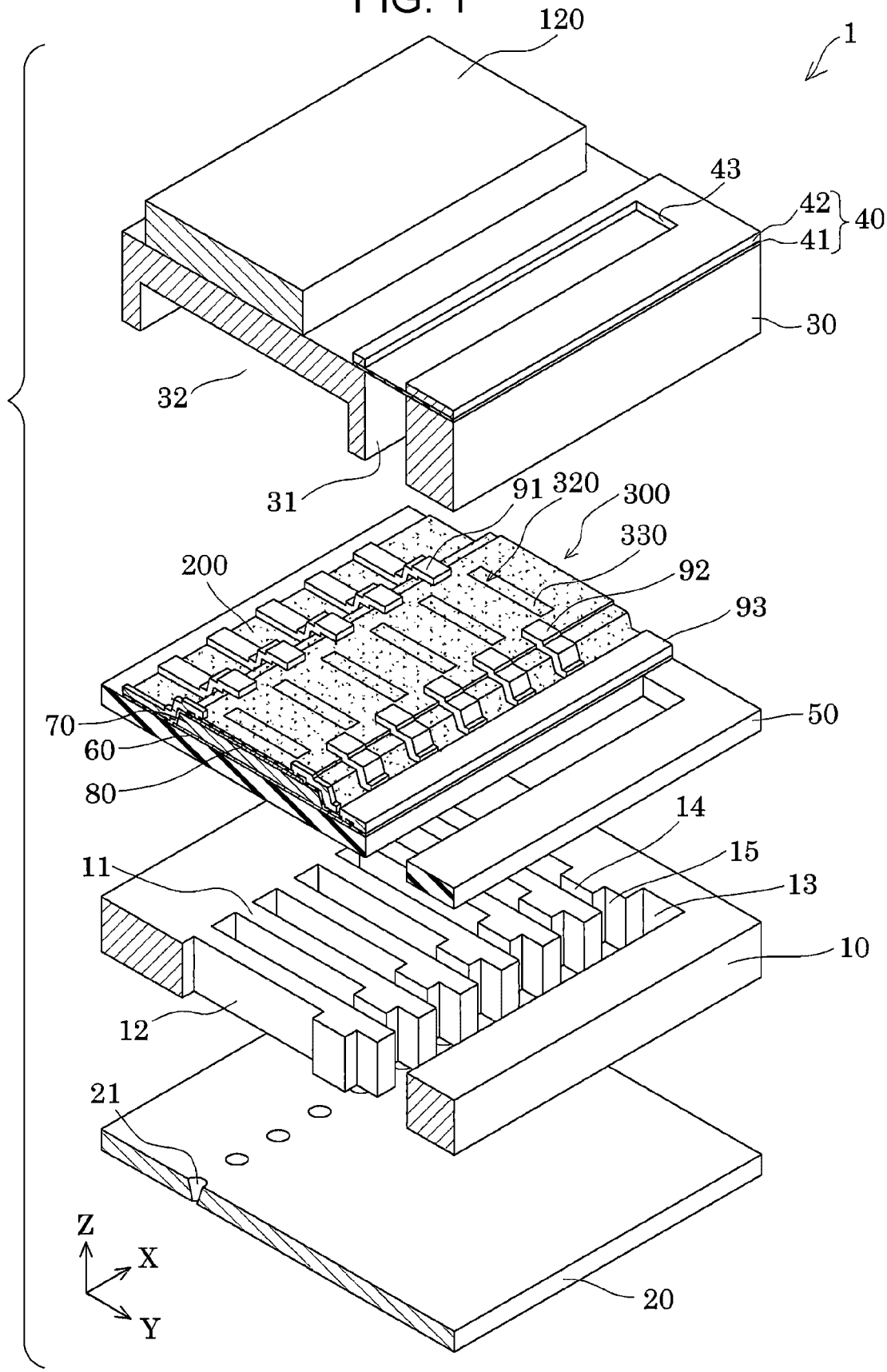
FIG. 1 is an exploded perspective view illustrating a recording head according to Embodiment 1 of the invention.
Figure 2:
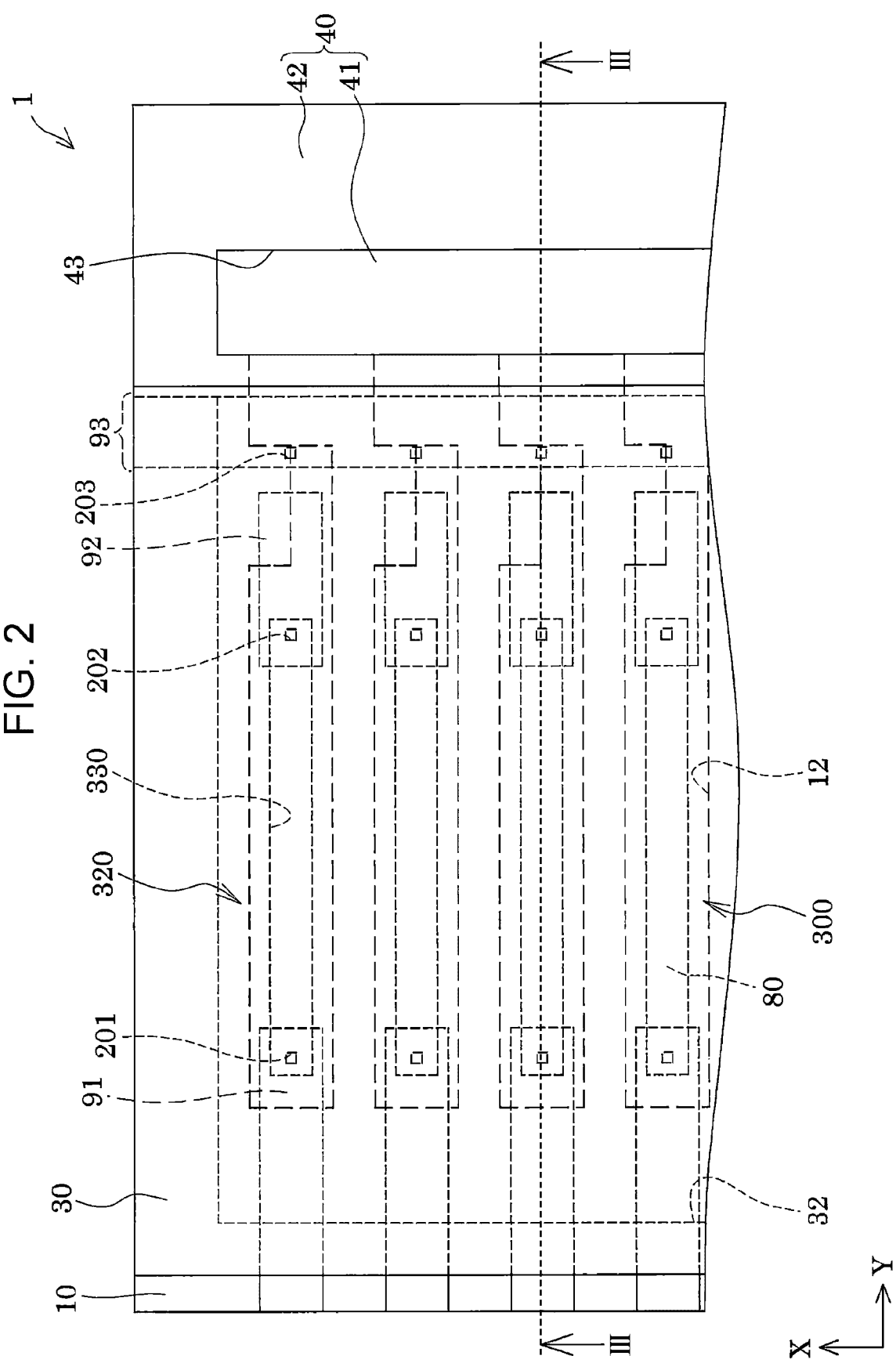
FIG. 2 is a plan view illustrating the recording head according to Embodiment 1 of the invention.
Figure 3:
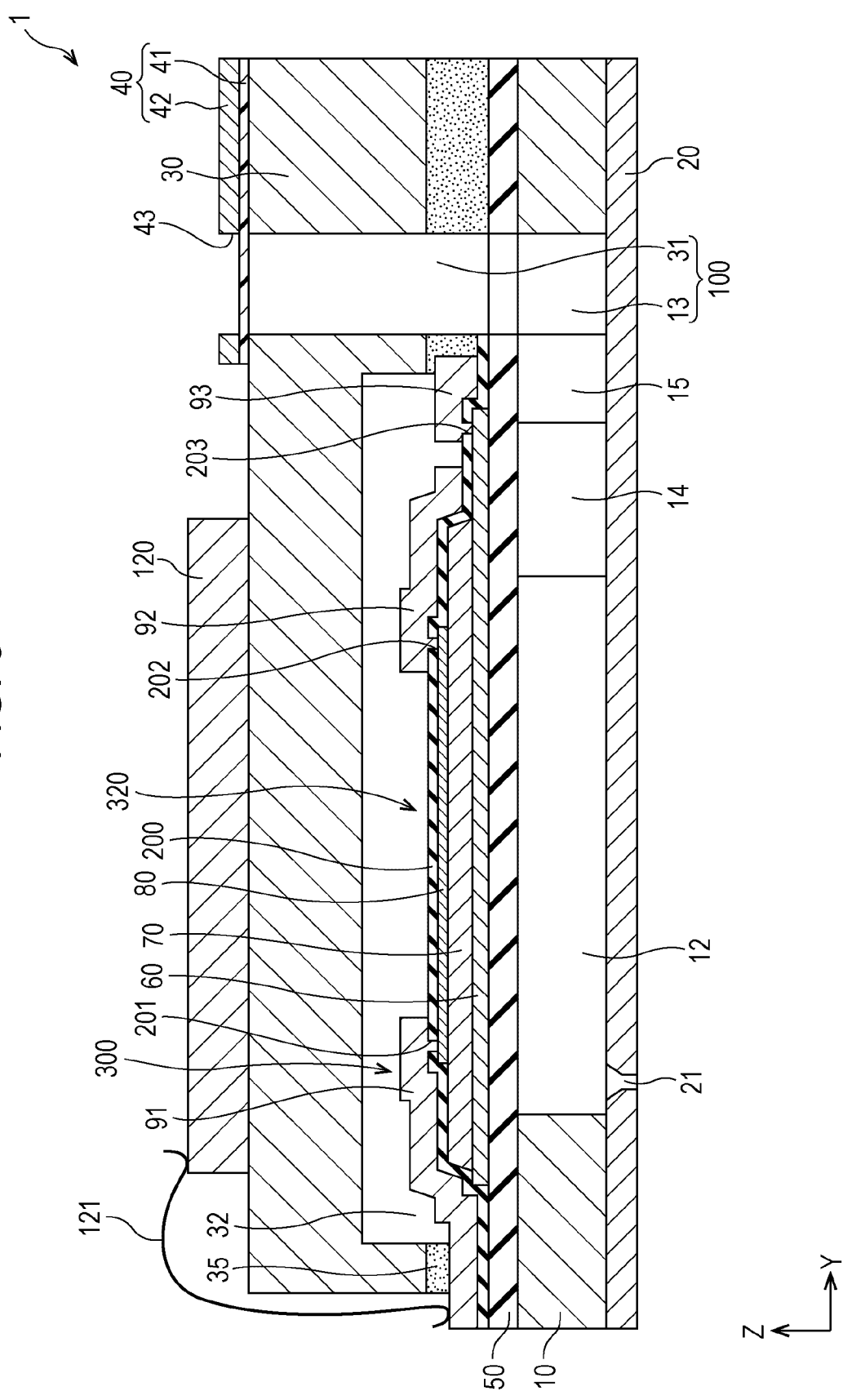
FIG. 3 is a sectional view illustrating the recording head according to Embodiment 1 of the invention.
Figure 4:
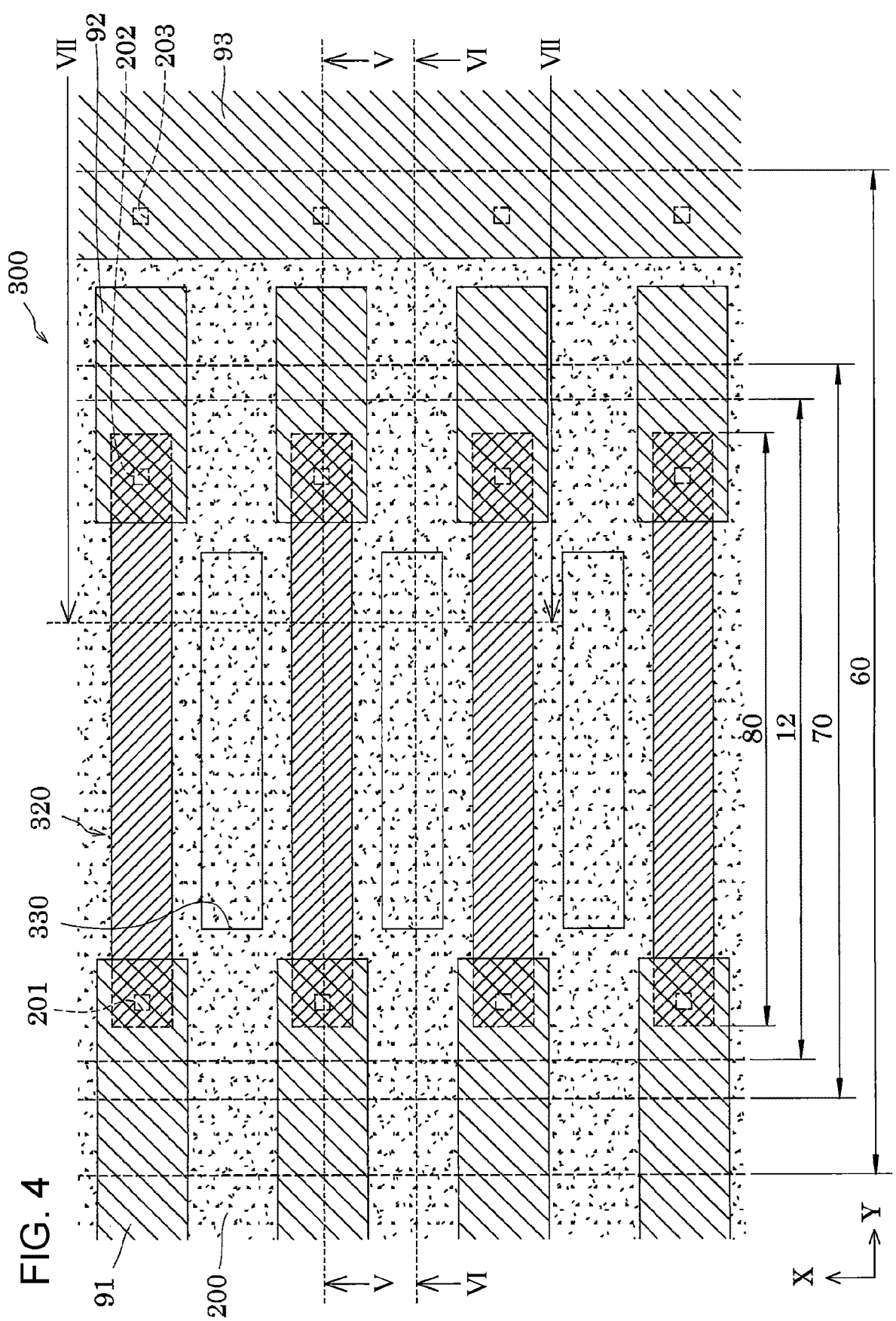
FIG. 4 is a plan view illustrating a main portion of a flow path forming substrate according to Embodiment 1 of the invention.
Figure 5:
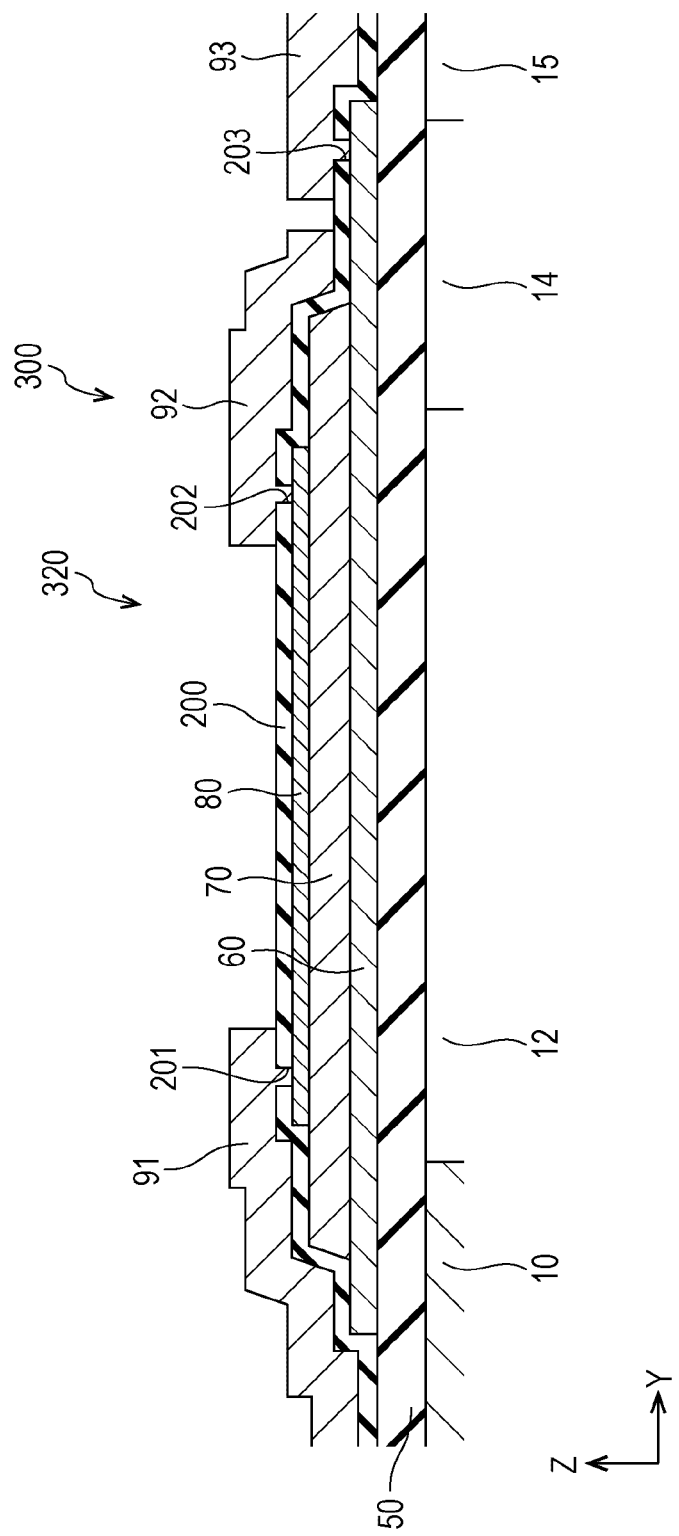
FIG. 5 is a sectional view illustrating a main portion of the recording head according to Embodiment 1 of the invention.
Figure 6:
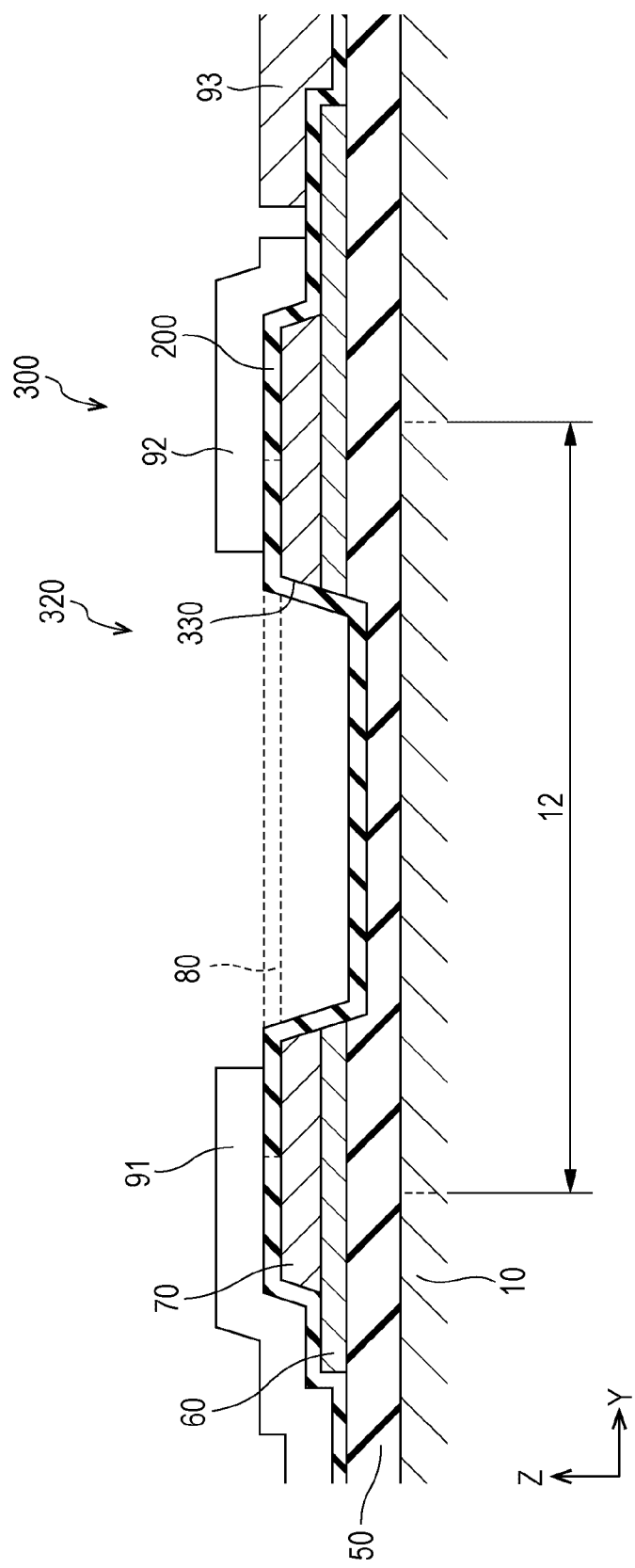
FIG. 6 is a sectional view of the main portion illustrating of the recording head according to Embodiment 1 of the invention.
Figure 7:
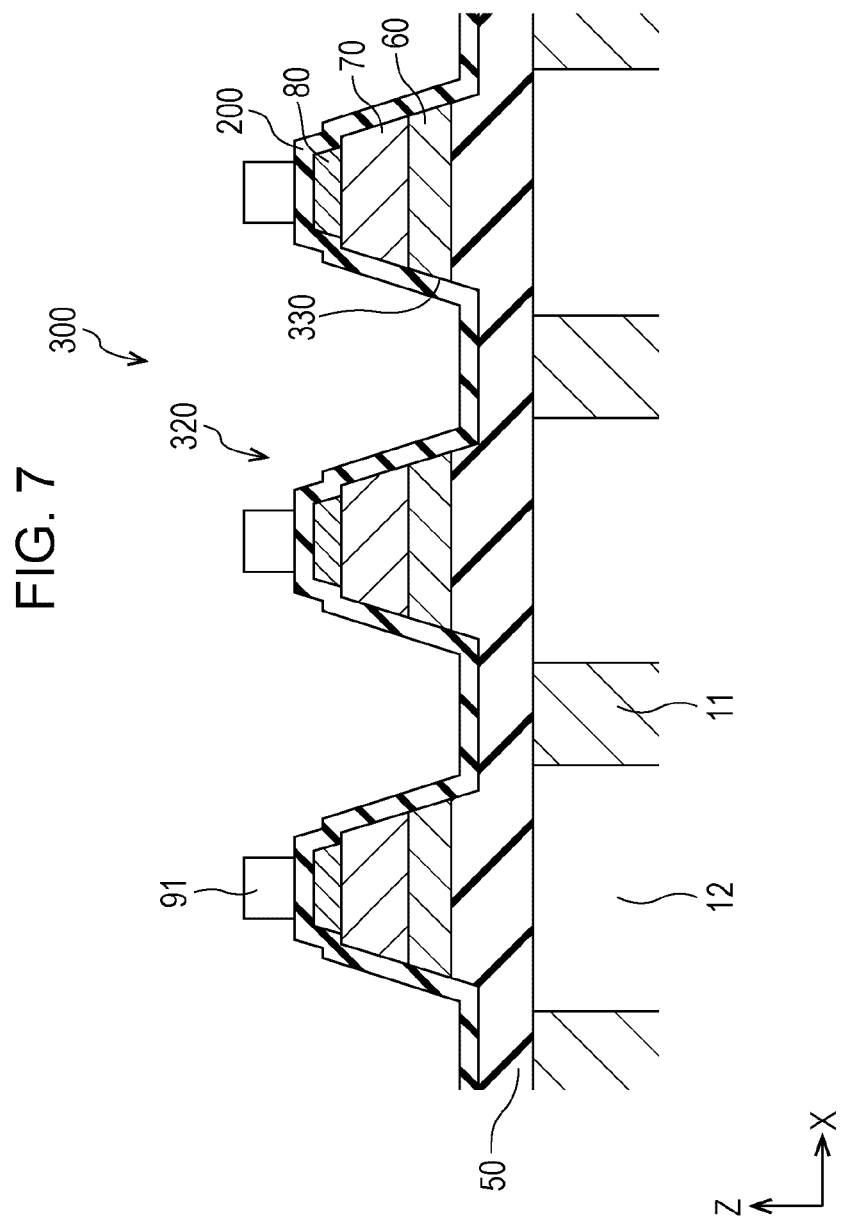
FIG. 7 is a sectional view illustrating the main portion of the recording head according to Embodiment 1 of the invention.

FIG. 1 is an exploded perspective view illustrating a schematic configuration of an ink jet type recording head as an example of a liquid ejecting head according to Embodiment 1 of the invention, FIG. 2 is a plan view illustrating the ink jet type recording head, FIG. 3 is a sectional view taken along line III-III in FIG. 2, FIG. 4 is a plan view illustrating a main portion of the flow path forming substrate, FIG. 5 is a sectional view taken along line V-V in FIG. 4, FIG. 6 is a sectional view taken along line VI-VI in FIG. 4, and FIG. 7 is a sectional view taken along line VII-VII in FIG. 4.

As illustrated in FIGS. 1 to 3, a flow path forming substrate 10, as a substrate of this embodiment constituting the ink jet type recording head 1 (hereinafter, also simply referred to as recording head 1), is made of a metal such as stainless steel or Ni, a ceramic material typified by $ZrO_2$ or $Al_2O_3$, a glass ceramic material, an oxide such as MgO, $LaAlO_3$, or the like can be used. In this embodiment, the flow path forming substrate 10 is made of a silicon single crystal substrate.

The flow path forming substrate 10 is subjected to anisotropic etching from one surface side so that a plurality of nozzles 21 through which ink is emitted by a pressure generation chambers 12 which is a recessed portion of this embodiment, defined by a plurality of partition walls 11 and are arranged in parallel in a direction in which the plurality of partitions are arranged in parallel. In this embodiment, this direction is referred to as a parallel arrangement direction of the pressure generation chambers 12 or a first direction X. In addition, a direction orthogonal to the first direction X in a surface of the liquid ejecting surface where a nozzle 21 opens is referred to as a second direction Y. Furthermore, a direction intersecting both the first direction X and the second direction Y is referred to as a third direction Z in this embodiment. In this embodiment, the relationship between the respective directions (X, Y, Z) is orthogonal, but a disposition relationship of each configuration is not necessarily limited to those orthogonal.

In addition, on the flow path forming substrate 10, an ink supply path 14 and a communication path 15 are defined by partition walls 11 on a side of one end portion in the second direction Y of the pressure generation chamber 12. In addition, at one end of the communication path 15, a communication portion 13 constituting a portion of the manifold 100, as is a common ink chamber (liquid chamber) of each pressure generation chamber 12, is formed. In other words, the flow path forming substrate 10 is provided with a liquid flow path including the pressure generation chamber 12, the communication portion 13, the ink supply path 14, and the communication path 15.

The ink supply path 14 communicates with a side of one end portion of the pressure generation chamber 12 in the second direction Y and has a smaller sectional region than the pressure generation chamber 12. For example, in this embodiment, the ink supply path 14 has a smaller width than a width of the pressure generation chamber 12 by narrowing a flow path on a side of the pressure generation chamber 12 between the manifold 100 and each pressure generation chamber 12 in the first direction X as a width direction. In this way, in this embodiment, the ink supply path 14 is formed by narrowing the width of the flow path from one side, but by narrowing the width of the flow path in the first direction X from both sides, the ink supply path may be formed. In addition, instead of narrowing the width of the flow path, the ink supply path may be formed by narrowing the flow path from the third direction Z as a stacked direction. Further, each of the communication paths 15 communicates with a side opposite to the pressure generation chamber 12 of the ink supply path 14 and has a sectional region larger than the width direction (first direction X) of the ink supply path 14. In this embodiment, the communication path 15 is formed with the same sectional region as the pressure generation chamber 12.

In other words, the flow path forming substrate 10 is provided with the pressure generation chamber 12, the ink supply path 14 having a smaller sectional region than the sectional region of the pressure generation chamber 12 in the first direction X, and a communication path 15 which communicates with the ink supply path 14 and has a sectional region larger than the sectional region of the ink supply path 14 in the first direction X are defined by a plurality of partition walls 11.

In addition, on a side of an opening surface of the flow path forming substrate 10, a nozzle plate 20 in which the nozzle 21 communicating with the vicinity of the end portion on a side opposite to the ink supply path 14 of each pressure generation chamber 12 is drilled is fixed by an adhesive, a heat welding film, or the like. As the nozzle plate 20, for example, a metal such as stainless steel (SUS), an organic material such as a polyimide resin, a glass ceramics, a silicon single crystal substrate, or the like can be used. By using the same silicon single crystal substrate as the flow path forming substrate 10 as the nozzle plate 20, the linear expansion coefficients of the nozzle plate 20 and the flow path forming substrate 10 are made equal to each other, and the occurrence of warpage due to heating and cooling, cracks, peeling, and the like due to heat can be suppressed.

On the other hand, as illustrated in FIGS. 3 and 5 to 7, a vibration plate 50 is formed on the side of opposite to the nozzle plate 20 of the flow path forming substrate 10. As the vibration plate 50, for example, a single layer or a stacked layer of at least one kind of material selected from silicon oxide, zirconium oxide, silicon nitride, polysilicon, and titanium oxide can be used.

When the pressure generation chamber 12 and the like is formed by anisotropically etching the flow path forming substrate 10 from the surface to which the nozzle plate 20 is joined, it is preferable that at least one side of the flow path forming substrate 10 of the vibration plate 50 use a material that functions as an etching stop layer. In other words, it is preferable that at least the side of the vibration plate 50 on the flow path forming substrate 10 be made of a material different in an etching selection ratio with respect to the flow path forming substrate 10. Thus, the pressure generation chambers 12 and the like can be formed with high precision by anisotropic etching.

In addition, a piezoelectric actuator 300 having a first electrode 60, a piezoelectric layer 70, and a second electrode 80 is provided on the vibration plate 50 of the flow path forming substrate 10. In this embodiment, the piezoelectric actuator 300 serves as a pressure generating means for causing a pressure change in the ink in the pressure generation chamber 12. Here, the piezoelectric actuator 300 is also referred to as a piezoelectric element and is referred to as a portion including the first electrode 60, the piezoelectric layer 70, and the second electrode 80. In addition, a portion where piezoelectric strain occurs in the piezoelectric layer 70 when a voltage is applied between the first electrode 60 and the second electrode 80 is referred to as an active portion 320. In this embodiment, an active portion 320 is formed for each pressure generation chamber 12, which will be described in detail later. In this embodiment, the first electrode 60 serves as a common electrode of the plurality of active portions 320, and the second electrode 80 serves as an individual electrode independent from each of the active portions 320. In addition, in the active portion 320, an end portion in the first direction X and an end portion in the second direction Y are defined by the second electrode 80.

As illustrated in FIGS. 5 and 6, the first electrode 60 is provided Y until reaching an outside of the end portion of the pressure generation chamber 12 in the second direction. In addition, the first electrode 60 is provided continuously over a plurality of the active portions 320. Specifically, both end portion sides of the first electrode 60 in the second direction Y are provided continuously in the first direction X, and the central portion of the first electrode 60 in the second direction Y is not provided only under the active portion 320, that is, between the adjacent active portions 320 to each other in the first direction X. In other words, in the first electrode 60 between the active portions 320 adjacent to each other in the first direction X, the center portion of the pressure generation chamber 12 in the second direction Y is removed by a groove portion 330 described below in detail.

As illustrated in FIG. 7, the width of the first electrode 60 in the first direction X has a width narrower than the width of the pressure generation chamber 12. In other words, when viewed in a plan view from the third direction Z, the first electrode 60 is provided so as to overlap with the pressure generation chamber 12.

For example, as such a first electrode 60, it is necessary that the first electrode 60 is made of a material that does not oxidize when the piezoelectric layer 70 is formed and can maintain conductivity, and examples of the first electrode 60 include noble metals such as platinum (Pt) and iridium (Ir), or a conductive oxide typified by lanthanum nickel oxide (LNO) or the like is suitably used.

As illustrated in FIGS. 5 and 6, the end portion of the piezoelectric layer 70 in the second direction Y is provided between the end portion of the first electrode 60 and the end portion of the second electrode 80. As will be described in detail below, an end portion of the second electrode 80 in the second direction Y defines an end portion of the active portion 320 and is disposed inside the end portion of the first electrode 60. The fact that the end portion of the piezoelectric layer 70 is provided between the end portion of the first electrode 60 and the end portion of the second electrode 80 in the second direction Y means that the end portion of the piezoelectric layer 70 includes the same position as that of the end portion of the first electrode 60 and is positioned inside the end portion of the first electrode 60 and includes the end portion of the second electrode 80 and is positioned outside the end portion of the second electrode 80. In other words, in the second direction Y, the fact that the end portion of the piezoelectric layer 70 is at the same position as the end portion of the first electrode 60 and the end portion of the piezoelectric layer 70 is at the same position as the end portion of the second electrode 80 are also included.

In this embodiment, the piezoelectric layer 70 is provided in the second direction Y until reaching the outside of the end portion of the pressure generation chamber 12. In other words, by providing the piezoelectric layer 70 across a boundary between a flexible portion facing the pressure generation chamber 12 of the vibration plate 50 and a non-flexible portion not facing the pressure generation chamber 12 in the second direction Y, the rigidity of the boundary between the flexible portion and the non-flexible portion of the vibration plate 50 can be improved, and breakage due to stress concentration at the boundary can be suppressed. Of course, in the second direction Y, the end portion of the piezoelectric layer 70 may be provided inside the end portion of the pressure generation chamber 12.

In addition, as illustrated in FIG. 4, the piezoelectric layer 70 is continuously provided over the plurality of active portions 320. Specifically, both end portions of the piezoelectric layer 70 in the second direction Y are provided continuously in the first direction X, and the central portion of the piezoelectric layer 70 in the second direction Y is not provided only under the active portion 320, that is, between the adjacent active portions 320 to each other in the first direction X. In other words, in the piezoelectric layer 70 between the active portions 320 adjacent to each other in the first direction X, the central portion of the pressure generation chamber 12 in the second direction Y is removed by the groove portion 330, which will be described below in detail.

As illustrated in FIG. 7, the width of the piezoelectric layer 70 in the first direction X has a width narrower than the width of the pressure generation chamber 12 in a portion where the groove portion 330 described below is provided in detail. In other words, when viewed in a plan view from the third direction Z, the piezoelectric layer 70 provided with the groove portion 330 is provided so as to overlap with the pressure generation chamber 12.

As a material of such a piezoelectric layer 70, for example, a ferroelectric piezoelectric material such as lead zirconate titanate (PZT), a relaxor to which a metal such as niobium, nickel, magnesium, bismuth or yttrium is added a ferroelectric or the like is used.

The second electrode 80 defines the end portions of the active portion 320 in the first direction X and the second direction Y. Therefore, as illustrated in FIGS. 5 and 7, the second electrode 80 is provided inside the end portion of the first electrode 60 in the first direction X and the second direction Y. Here, in the second direction Y, the fact that the end portion of the second electrode 80 is provided inside the end portion of the first electrode 60 means that the end portion of the second electrode 80 in the second direction Y is not provided at the same position as the end portion of the first electrode 60 but the end portion of the second electrode 80 is positioned inside the first electrode 60 than the end portion of the first electrode 60, that is, the center side of the first electrode 60. The same applies to the first direction X.

In this embodiment, the end portion of the second electrode 80 in the second direction Y is positioned inside the end portion of the pressure generation chamber 12. In other words, the end portion of the pressure generation chamber 12 is positioned between the first electrode 60 and the piezoelectric layer 70. In other words, the second electrode 80 is provided with a length shorter than that of the pressure generation chamber 12 in the second direction Y, and when viewed in a plan view from the third direction Z, the second electrode 80 is provided at a position and a length overlapping the pressure generation chamber 12 in the second direction Y.

The piezoelectric actuator 300 having the first electrode 60, the piezoelectric layer 70, and the second electrode 80 has a groove portion 330 that opens between the active portions 320 adjacent to each other in the first direction X.

As illustrated in FIG. 7, the groove portion 330 is provided between the active portions 320 adjacent to each other in the first direction X, penetrates the piezoelectric layer 70 and the first electrode 60 in the third direction Z, and has a depth reaching a portion of the thickness of the vibration plate 50 in the third direction Z. In other words, the groove portion 330 is formed without penetrating the vibration plate 50, and a portion of the vibration plate 50 on a side of the flow path forming substrate 10 is formed on a bottom surface of the groove portion 330.

Such a groove portion 330 is formed so that the end portion in the first direction X is inside the end portion of the pressure generation chamber 12. In other words, the groove portion 330 is formed at a position overlapping the partition wall 11 between the pressure generation chambers 12 adjacent to each other in the first direction X in a plan view from the third direction and has a width larger than that of the partition wall 11.

Here, the end portion of the groove portion 330 in the first direction X is the end portion on a side of the flow path forming substrate 10 in the third direction Z. In other words, the end portion of the groove portion 330 in the first direction X is formed as an inclined surface inclined with respect to the third direction Z, and even if only the end portion of the inclined surface on the opposite side to the flow path forming substrate 10 is inside the end portion of the pressure generation chamber 12, in a case where the end portion of the inclined surface on a side of the flow path forming substrate 10 is outside the end portion of the pressure generation chamber 12, the end portion of the groove portion 330 in the first direction X is disposed inside the end portion of the pressure generation chamber 12.

In this embodiment, in the first direction X, all of the side surfaces of the groove portion 330 are provided so as to be inside the end portion of the pressure generation chamber 12.

In addition, the groove portion 330 is formed with a width narrower than the widths of the second electrodes 80 adjacent to each other in the first direction X. Therefore, the groove portion 330 is provided so as to open on the surface of the piezoelectric layer 70 on the side of the second electrode 80 in the third direction Z. The groove portion 330 is not limited to this, for example, the width in the first direction X may be the same as the width between the second electrodes 80 adjacent to each other in the first direction X.

In addition, on the inner surface in the first direction X, the groove portion 330 is provided such that the end surface of the piezoelectric layer 70, the end surface of the first electrode 60, and the end surface from which a portion of the third direction Z as the stacked direction of the vibration plate 50 is removed are provided so as to be flush one another. In other words, the groove portion 330 is formed by simultaneously etching the piezoelectric layer 70, the first electrode 60, and a portion of the vibration plate 50. This makes it possible to position the end surface of the piezoelectric layer 70, the end surface of the first electrode 60, and the end surface of the portion removed by etching of the vibration plate 50, forming the groove portion 330 with high accuracy.

The position of such a groove portion 330 in the second direction Y will be described in detail below, but it is disposed inside the end portion of the individual lead electrode 91 as a leading-out wiring of the second electrode 80.

By providing the groove portion 330 in such a piezoelectric actuator 300, it is possible to reduce the film thickness of the region facing the pressure generation chamber 12, that is, the so-called arm portion, outside the active portion 320 of the vibration plate 50 in the first direction X, without changing the film thickness and material of the vibration plate 50 directly under the active portion 320. In other words, in the first direction X, the piezoelectric layer 70 is not provided on the arm portion outside the active portion 320, so that the rigidity of the arm portion can be reduced. Likewise, without providing the first electrode 60 on the arm portion outside the active portion 320 in the first direction X, the rigidity of the arm portion can be reduced. In addition, by removing a portion of the arm portion in the third direction Z, as a stacked direction of the vibration plate 50, the rigidity of the arm portion can be reduced. In particular, the first electrode 60 is a common electrode common to the plurality of active portions 320, but without providing the first electrode 60 made of a metal or metal oxide having high rigidity on the arm portion, the rigidity of the arm portion can be reduced. As illustrated above, by reducing the rigidity of the arm portion of the vibration plate 50, it is possible to improve the displacement characteristics of the piezoelectric actuator 300, that is, to obtain a large displacement amount with a low drive voltage.

In addition, the piezoelectric actuator 300 is covered with the protective film 200. The protective film 200 is made of an insulating material having moisture resistance. As the protective film 200, an inorganic insulating material, an organic insulating material, or the like can be used. As the inorganic insulating material which can be used as the protective film 200, at least one type selected from silicon oxide ($SiO_x$), zirconium oxide ($ZrO_x$), tantalum oxide ($TaO_x$), aluminum oxide ($AlO_x$), and titanium oxide ($TiO_x$) include. As the inorganic insulating material of the protective film 200, it is particularly preferable to use aluminum oxide ($AlO_x$) which is an inorganic amorphous material, for example, alumina ($Al_2O_3$).

In addition, as the organic insulating material which can be used as the protective film 200, for example, at least one type selected from an epoxy resin, a polyimide resin, a silicone resin and a fluorine resin include.

In this embodiment, the protective film 200 covers the entire piezoelectric actuator 300. In other words, the protective film 200 is provided over the inner surface of the groove portion 330 of the piezoelectric actuator 300. Incidentally, by providing the protective film 200 in the groove portion 330, it is possible to suppress the breakage of the piezoelectric layer 70 due to leakage of current between the first electrode 60 and the second electrode 80 exposed on the inner surface of the groove portion 330. In other words, the protective film 200 may cover at least the surface of the piezoelectric layer 70 provided with the first electrode 60 and the second electrode 80 close to each other. Therefore, the protective film 200 may not be provided in the main portion as a substantially central region of the upper surface of the second electrode 80 but may be provided with an opening portion which opens the main portion of the second electrode 80. By providing an opening portion in the protective film 200 described above, it is possible to suppress the inhibition of the displacement by the protective film 200 and to improve the displacement of the piezoelectric actuator 300.

In addition, by covering the piezoelectric actuator 300 with the protective film 200, breakage of the piezoelectric layer 70 due to current leakage between the first electrode 60 and the second electrode 80 can be suppressed. In addition, the protective film 200 can function as an interlayer insulating film which insulates the leading-out wirings leaded out from the first electrode 60 (to be described below) and the second electrode 80 (to be described below), and it is possible to suppress the short circuit between the electrodes.

On the protective film 200, lead electrodes which are the leading-out wirings leaded out from the first electrode 60 and the second electrode 80 of the piezoelectric actuator 300 are provided.

As illustrated in FIGS. 4 to 6, the lead electrode of this embodiment has an individual lead electrode 91, a dummy individual lead electrode 92, and a common lead electrode 93.

The individual lead electrode 91 is connected to the end portion of the second electrode 80 on the side of the nozzle 21 in the second direction Y and extends in the second direction Y on the protective film 200 on the vibration plate 50, that is, extends to the outside of the end portion of the first electrode 60. Such an individual lead electrode 91 is electrically connected to the second electrode 80 through the first connection hole 201 provided in the protective film 200.

The dummy individual lead electrode 92 is connected to an end portion of the second electrode 80 on a side of the ink supply path 14 in the second direction Y and extends in the second direction Y on the protective film 200 on the vibration plate 50, that is, extends to the outside of the end portion of the piezoelectric layer 70. Such a dummy individual lead electrode 92 is electrically connected to the second electrode 80 through the second connection hole 202 provided in the protective film 200. The dummy individual lead electrode 92 is provided inside the end portion of the first electrode 60 in the second direction Y. In other words, the first electrode 60 extends to the outside of the dummy individual lead electrode 92 in the second direction Y.

In this embodiment, the individual lead electrode 91 is connected to the end portion of the second electrode 80 on the side of the nozzle 21 in the second direction Y, the dummy individual lead electrode 92 is connected at the end portion of the second electrode 80 on a side of the ink supply path 14, but there is no trouble even if this is reversed for convenience of the driving circuit and wiring.

The common lead electrode 93 is electrically connected outside the dummy individual lead electrode 92 in the second direction Y through the first electrode 60 and a third connection hole 203 provided in the protective film 200. Such a common lead electrode 93 is provided at intervals so as to be discontinuous from the dummy individual lead electrode 92. In addition, the common lead electrode 93 is provided continuously in the first direction X. By providing the common lead electrode 93 continuously in the first direction X as described above, the electric resistance at both end portions of the first electrode 60 in the first direction X is lowered so that the voltage drop of first electrode 60 in the first direction X can be suppressed.

In this embodiment, by providing the dummy individual lead electrodes 92, the electric field applied to the piezoelectric layer 70 can be made symmetrical at both end portions in the second direction Y. In other words, in the second direction Y, since the individual lead electrode 91 is provided outside the second electrode 80 on the side of the nozzle 21, a series circuit is formed by the protective film 200 interposed between the individual lead electrode 91 and the first electrode 60. Accordingly, the electric field strength under the first electrode 60 on which the individual lead electrode 91 is formed decreases. On the other hand, unless a dummy individual lead electrode 92 is provided on the outside of the second electrode 80 on a side of the ink supply path 14, a series circuit such as the individual lead electrode 91 is not formed so that the electric field strength does not decrease. Therefore, unless the dummy individual lead electrodes 92 are provided, the electrically asymmetric is generated at both end portions of the piezoelectric actuator 300 in the second direction Y. In this embodiment, by providing the dummy individual lead electrodes 92 connected to the second electrode 80 at the end portion on a side opposite to the individual lead electrode 91, the electric field strength at both end portions of the piezoelectric actuator 300 in the second direction Y can similarly be reduced and can be electrically symmetrical.

In addition, by providing the dummy individual lead electrodes 92, the stacked structure of the piezoelectric actuator 300 can be made symmetrical at both end portions in the second direction Y. In other words, unless the dummy individual lead electrode 92 is provided, the stacked structures which are different from each other are formed at both end portions of the active portion 320 in the second direction Y, so that the rigidity at both end portions of the active portion 320 becomes asymmetric. In this embodiment, by providing the dummy individual lead electrode 92 connected to the second electrode 80 at the end portion on a side opposite to the individual lead electrode 91, the same stacked structure is applied to both end portions of the piezoelectric actuator 300 in the second direction Y, and it is possible to make the rigidity symmetrical.

Therefore, since the electrical characteristics and structural characteristics of the piezoelectric actuator 300 can be made symmetrical in the second direction Y, only the excessive deformation of one end portion is suppressed and breakage by stress concentration can be suppressed. In other words, unless the dummy individual lead electrode 92 is provided, the end portion where the individual lead electrode 91 is not provided does not decrease the electric field strength and is excessively deformed due to low rigidity thereof and thus is likely to be destroyed by stress concentration. By providing the dummy individual lead electrode 92, it is possible to improve the rigidity by decreasing the electric field strength like the end portion provided with the individual lead electrode 91, suppressing excessive deformation and breakage due to stress concentration can be suppressed.

In this embodiment, the dummy individual lead electrode 92 and the common lead electrode 93 are disposed with an interval in the second direction Y, but the invention is not particularly limited thereto. For example, if the common lead electrode 93 is provided between adjacent active portions 320 in the first direction X, that is, between the adjacent dummy individual lead electrodes 92, a portion of the third connection hole 203 which connects the common lead electrode 93 and the first electrode 60 can be brought close to the active portion 320 in the second direction Y. In other words, the dummy individual lead electrode 92 and the common lead electrode 93 can be disposed at a position overlapping in the second direction Y. Therefore, by providing the dummy individual lead electrode 92, the separation of the connection position between the common lead electrode 93 and the first electrode 60 from the active portion 320 is suppressed, and thus the electrical resistance of the first electrode 60 having a relatively small thickness can be reduced and the distance between the common lead electrodes 93 can be shortened to lower the electrical resistance.

As described above, the groove portion 330 formed in the piezoelectric actuator 300 provided with the individual lead electrode 91, the dummy individual lead electrode 92, and the common lead electrode 93 will be described in more detail.

As illustrated in FIGS. 4 and 6, the end portion of the groove portion 330 on the side of the nozzle 21 in the second direction Y is provided inside the end portion of the individual lead electrode 91 as the leading-out wiring. Here, the end portion of the individual lead electrode 91 means an end portion connected to the active portion 320 of the individual lead electrode 91, that is, an end portion provided at a position overlapping the active portion 320 in the third direction Z. The fact that the end portion of the groove portion 330 is provided inside the end portion of the individual lead electrode 91 means that the end portion of the groove portion 330 on the side of the individual lead electrode 91 is positioned on a side opposite to the individual lead electrode 91, that is, means that the end portion of the groove portion 330 is positioned on the center side of the active portion 320 where the individual lead electrode 91 is not provided.

In addition, the end portion of the groove portion 330 does not include in the inside of the end portion of the individual lead electrode 91 that the end portion of the groove portion 330 and the end portion of the individual lead electrode 91 are provided at the same position in the second direction Y. In other words, the fact that the end portion of the groove portion 330 is positioned inside the end portion of the individual lead electrode 91 means that a gap is provided between the end portion of the groove portion 330 and the end portion of the individual lead electrode 91 in the second direction Y.

The end portion of the groove portion 330 is an end portion on a side of the flow path forming substrate 10 in the third direction Z. For example, even in a case where the inner surface of the end portion of the groove portion 330 is an inclined surface inclined with respect to the third direction Z, the end portion of the inclined surface of the groove portion 330 on a side of the flow path forming substrate 10 is inside the end portion of the individual lead electrode 91, and may include a state of being disposed in the opposite disposition in other portions.

In addition, the end portion of the individual lead electrode 91 refers to the end portion on a side of the flow path forming substrate 10 in the third direction Z. For example, even when the end surface of the individual lead electrode 91 is an inclined surface inclined with respect to the third direction Z, the end portion of the groove portion 330 of the inclined surface of the individual lead electrode 91 on a side of the flow path forming substrate 10 may be positioned outside the end portion on a side of the flow path forming substrate 10 and includes a state of being disposed in the opposite disposition in other portions.

Furthermore, the groove portion 330 is provided with the end portion on a side of the ink supply path 14 in the second direction Y inside the end portion of the dummy individual lead electrode 92. Here, the dummy individual lead electrode 92 is a dummy leading-out wiring, and the end portion of the dummy individual lead electrode 92 is the end portion connected to the active portion 320 of the dummy individual lead electrode 92, that is, the end portion which is positioned at a position overlapping with the active portion 320 in the third direction Z. The fact that the end portion of the groove portion 330 is provided inside the end portion of the dummy individual lead electrode 92 means that the end portion of the groove portion 330 on a side of the dummy individual lead electrode 92 is positioned a side opposite to a direction extending the dummy individual lead electrode 92, that is, on the center side of the active portion 320 where the dummy individual lead electrode 92 is not provided.

In addition, the end portion of the groove portion 330 does not include in the inside of the end portion of the dummy individual lead electrode 92 that the end portion of the groove portion 330 and the end portion of the dummy individual lead electrode 92 are provided at the same position in the second direction Y. In other words, the fact the end portion of the groove portion 330 is positioned inside the end portion of the dummy individual lead electrode 92 means that a gap is provided between the end portion of the groove portion 330 and the end portion of the dummy individual lead electrode 92 in the second direction Y.

In addition, the end portion on the side of the dummy individual lead electrode 92 is the end portion on a side of the flow path forming substrate 10 in the third direction Z similarly to the end portion of the individual lead electrode 91.

Therefore, in the second direction Y, the groove portion 330 is provided between the end portion of the individual lead electrode 91 and the end portion of the dummy individual lead electrode 92 to have a length shorter than an interval between the end portion of the individual lead electrode 91 and the end portion of the dummy individual lead electrode 92.

As described above, by disposing the end portion of the groove portion 330 inside the end portion of the individual lead electrode 91 in the second direction Y, since the boundary of the groove portion 330 can be disposed in a portion where the stacked structure of the vibration plate 50, the piezoelectric actuator 300, and the individual lead electrode 91 as a leading-out wiring is not changed, the stress concentration of the piezoelectric actuator 300 can be suppressed, and the breakage of the piezoelectric actuator 300 can be suppressed. In other words, at the end portion of the active portion 320, since the portion where the individual lead electrode 91 is provided hinders restricted deformation by the individual lead electrode 91, deformation is hindered. Therefore, if the end portion of the groove portion 330 is provided at the same position as the end portion of the individual lead electrode 91, since the boundary between the portion restricted by the individual lead electrode 91 of the active portion 320 and the portion not restricted by the individual lead electrode 91 and the boundary at which the rigidity changes due to the groove portion 330 of the vibration plate 50 which coincide with each other, and the rigidity greatly changes at these boundaries, there is a possibility that stress concentrates at the boundaries and breakage occurs.

In this embodiment, by disposing the end portion of the groove portion 330 inside the end portion of the individual lead electrode 91 in the second direction Y, the position of the boundary where the stacked structure of the individual lead electrode 91 changes and the position of the boundary where the rigidity of the vibration plate 50 is changed can be shifted from each other, big change in the rigidity can be suppressed, the occurrence of stress concentration at the end portion of the individual lead electrode 91 and the end portion of the groove portion 330 can be suppressed, and thus occurrence of breakage can be suppressed.

In addition, since the rigidity can be gradually lowered, in the second direction Y, from the region of high rigidity where the individual lead electrode 91 is provided, through the region where the individual lead electrode 91 and the groove portion 330 are not provided and the rigidity becomes medium, until reaching the region where the individual lead electrode 91 is not provided and the groove portion 330 is provided and rigidity becomes low, by smoothly changing the rigidity, the occurrence of stress concentration is further suppressed and breakage can be further suppressed.

In addition, in this embodiment, the end portion of the groove portion 330 is disposed inside the end portion of the individual lead electrode 91 in the second direction Y, so that the first electrode 60 is not divided for each active portion 320 by the groove portions 330, the first electrode 60 can be used as the common electrode of the plurality of active portions 320. In addition, by making the end portion of the groove portion 330 inside the end portion of the individual lead electrode 91, since it is possible to leave the first electrode 60 wide outside the groove portion 330 in the second direction Y, it is possible to suppress the voltage drop in the first direction X of the first electrode 60 by lowering the electric resistance of the first electrode 60 and suppress the variation in the displacement amount of the active portion 320. In other words, it is possible to suppress the occurrence of variations in the displacement amount of the active portion 320 due to the difference in the number of simultaneously driving the active portions 320, and to drive the active portion 320, so as to always have the same displacement amount, and it is possible to stabilize the emitting characteristics of ink droplet and improve the printing quality.

In this embodiment, in the second direction Y, the end portion of the groove portion 330 on a side of the ink supply path 14 is positioned inside the end portion of the dummy individual lead electrode 92. Therefore, also on a side of the ink supply path 14 of the piezoelectric actuator 300, similarly to the side of the individual lead electrode 91, the rigidity is not abruptly changed, the greatly change of the rigidity is suppressed, and the rigidity gradually changes, it is possible to suppress the occurrence of stress concentration at the end portion of the individual lead electrode 91 and the end portion of the groove portion 330 and to suppress the breakage.

In addition, ever on a side of the dummy individual lead electrode 92, by the first electrode 60 being not divided by the groove portion 330 for each active portion 320 and the end portion of the groove portion 330 being positioned inside the end portion of the dummy individual lead electrode 92, since the first electrode 60 can be provided wider outside the groove portion 330 in the second direction Y, the electric resistance of the first electrode 60 in the first direction X decreases, and the voltage drop can be further suppressed.

Further, on the flow path forming substrate 10 on which the piezoelectric actuator 300 is formed, a protective substrate 30 having a manifold portion 31 provided in a region facing the communication portion 13 is joined through an adhesive 35. As described above, the manifold portion 31 communicates with the communication portion 13 of the flow path forming substrate 10 to constitute a manifold 100 to be a common liquid chamber of each pressure generation chamber 12. In addition, the communication portion 13 of the flow path forming substrate 10 may be divided into a plurality of communication portions for each pressure generation chamber 12, and only the manifold portion 31 may be a manifold. Further, for example, the ink supply path 14 may be provided in which only the pressure generation chamber 12 is provided in the flow path forming substrate 10, and the member (for example, vibration plate 50) interposed between the flow path forming substrate 10 and the protective substrate 30 communicates a manifold with the pressure generation chambers 12.

In addition, the protective substrate 30 is provided with a piezoelectric element holding portion 32 which has a space that does not hinder the movement of the piezoelectric actuator 300 in a region facing the piezoelectric actuator 300. It is sufficient that the piezoelectric element holding portion 32 has a space that does not hinder the movement of the piezoelectric actuator 300, and the space may be sealed or not sealed.

In addition, a driving circuit 120 for driving the piezoelectric actuator 300 is mounted on the protective substrate 30. As the driving circuit 120, for example, a circuit substrate, a semiconductor integrated circuit (IC), or the like can be used. The driving circuit 120, the individual lead electrode 91, and the common lead electrode 93 are electrically connected to each other through a connection wiring 121 formed of a conductive wiring such as a bonding wiring.

As the protective substrate 30, it is preferable to use a material having substantially the same thermal expansion coefficient as that of the flow path forming substrate 10, for example, glass, a ceramic material, an oxide, or the like, and in this embodiment, the silicon single crystal substrate same as the flow path forming substrate 10 was used.

In addition, on the protective substrate 30, a compliance substrate 40 including a sealing film 41 and a fixing plate 42 is joined. Here, the sealing film 41 is made of a material having low rigidity and flexibility (for example, a polyphenylene sulfide (PPS) film having a thickness of 6 μm), and one surface of the manifold portion 31 is sealed by the sealing film 41. In addition, the fixing plate 42 is formed of a hard material such as metal (for example, stainless steel (SUS) having a thickness of 30 μm or the like). Since the region of the fixing plate 42 facing the manifold 100 is the opening portion 43 completely removed in the thickness direction, one side surface of the manifold 100 is sealed only with the flexible sealing film 41.

In such an ink jet type recording head of this embodiment, ink is taken in from an external ink supply section (not illustrated), and the interior thereof is filled with ink until the ink reaches from the manifold 100 to the nozzle 21, and then, according to the recording signal from the driving circuit 120, a voltage is applied between the first electrode 60 and the second electrode 80 corresponding to each pressure generation chamber 12 to deflect and deform the vibration plate 50, the first electrode 60, and the piezoelectric layer 70, whereby each pressure generation chamber 12 increases, and ink droplets are emitted from the nozzle 21.

Here, a method for manufacturing the recording head 1 of this embodiment, particularly a method for manufacturing the groove portion 330 will be described with reference to FIGS. 8 to 10.

Figure 8:
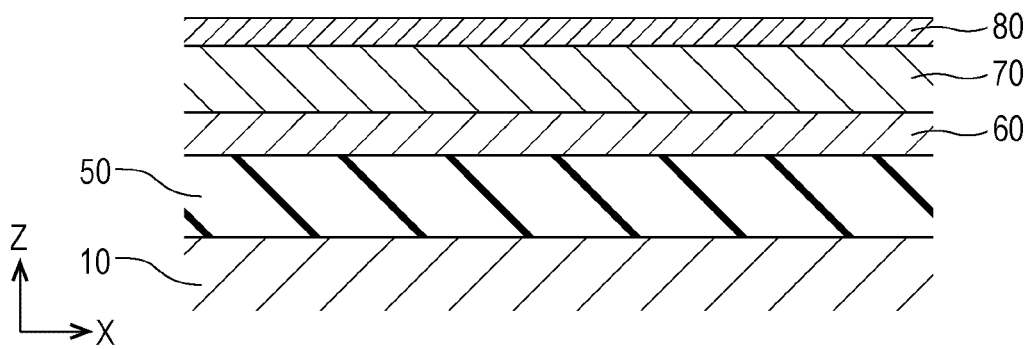
FIG. 8 is a sectional view illustrating a method for manufacturing a recording head according to Embodiment 1 of the invention.

As illustrated in FIG. 8, the vibration plate 50, the first electrode 60, the piezoelectric layer 70, and the second electrode 80 are stacked over one surface of the flow path forming substrate 10.

As a method for manufacturing the vibration plate 50, for example, the vibration plate 50 made of silicon oxide can be formed by thermally oxidizing the flow path forming substrate 10 made of a silicon single crystal substrate. Of course, the vibration plate 50 may be formed by a sputtering method or the like.

The first electrode 60 and the second electrode 80 can be formed by, for example, a sputtering method or the like.

In addition, the piezoelectric layer 70 may be formed by a liquid phase method such as a sol-gel method or a Metal-Organic Decomposition (MOD) method, a Physical Vapor Deposition (PVD) method (vapor phase method) such as a sputtering method and a laser ablation method.

Figure 9:
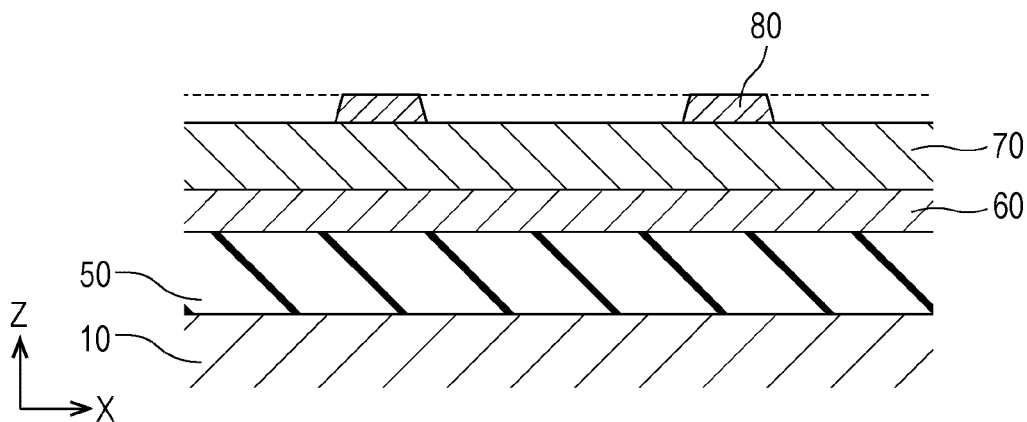
FIG. 9 is a sectional view illustrating the method for manufacturing a recording head according to Embodiment 1 of the invention.

Next, as illustrated in FIG. 9, the second electrode 80 is patterned by etching.

Figure 10:
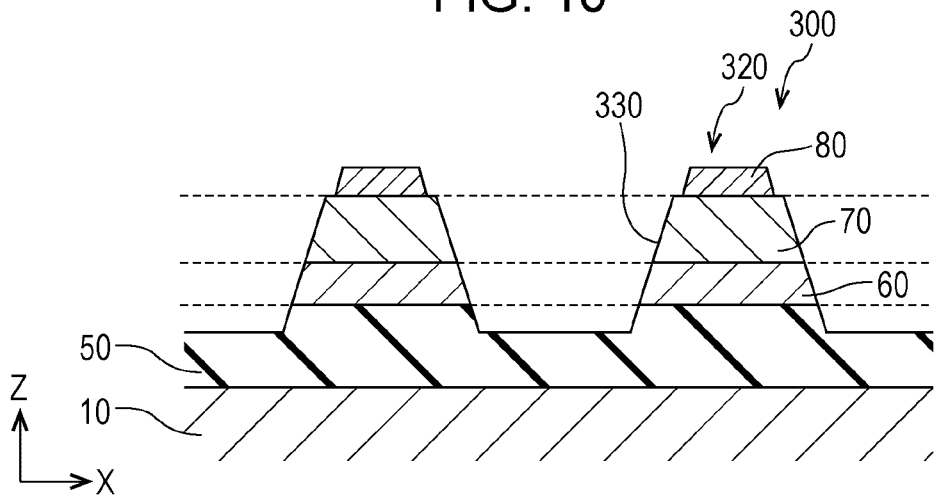
FIG. 10 is a sectional view illustrating the method for manufacturing a recording head according to Embodiment 1 of the invention.

Next, as illustrated in FIG. 10, the piezoelectric layer 70 and the first electrode 60 are patterned at the same time by etching, and etching is performed until reaching a portion of the vibration plate 50 in the third direction Z, whereby the groove portion 330 is formed. In other words, the groove portion 330 is formed by collectively etching the piezoelectric layer 70, the first electrode 60, and a portion of the vibration plate 50 in the third direction Z as a stacked direction. Note that in the collective etching for forming the groove portion 330, dry etching or reactive ion etching (RIE) can be performed.

As illustrated above, the piezoelectric layer 70, the first electrode 60, and a portion of the vibration plate 50 are collectively etched to form the groove portion 330. Accordingly, the inner surface of the groove portion 330 is flush with the end surface of the piezoelectric layer 70, the end surface of the first electrode 60, and the end surface of the portion of the vibration plate 50 removed by etching. Therefore, the positioning between the end surface of the piezoelectric layer 70, the end surface of the first electrode 60 and the end surface of the portion of the vibration plate 50 removed by etching, which form the groove portion 330, can be performed with high accuracy.

After that, the protective film 200 is formed and patterned to form a first connection hole 201, a second connection hole 202, and a third connection hole 203, and then a metal layer to be a leading-out wiring is formed over the entire surface and is patterned, individual lead electrodes 91, dummy individual lead electrodes 92, and common lead electrodes 93 are formed.

As described above, in the recording head 1 as an example of the liquid ejecting head of this embodiment, the flow path forming substrate 10 in which a plurality of pressure generation chambers 12 communicating with the nozzles 21 are arranged in parallel in the first direction X, and the piezoelectric actuator 300 which has the first electrode 60 provided on one surface side of the flow path forming substrate 10 through the vibration plate 50, the piezoelectric layer 70 provided on the first electrode 60, and the second electrode 80 provided on the piezoelectric layer 70, the piezoelectric actuator 300 is provided with the active portion 320 obtained by inserting the first electrode 60 and the second electrode 80 of the piezoelectric layer 70 for each pressure generation chamber 12, the first electrode 60 constitutes a common electrode commonly provided to the plurality of active portions 320 and the second electrode 80 constitutes individual electrodes independently provided for each of the active portions 320, the end portion of the first electrode 60 is provided outside the end portion of the second electrode 80 in the second direction Y as the in-plane direction of one surface of the flow path forming substrate 10 and is orthogonal to the first direction X, and the end portion of the piezoelectric layer 70 is provided between the end portion of the first electrode 60 and the end portion of the second electrode 80, and in the second direction Y, the individual lead electrodes 91 as a leading-out wiring leaded out in the second direction Y from one end portion of the second electrode 80 is provided, between the active portions 320 which are adjacent to each other in the first direction X, the groove portion 330 which is provided in the third direction Z as a stacked direction of the second electrode 80, the piezoelectric layer 70, the first electrode 60, and the vibration plate 50, and, in the second direction Y, the end portion of the groove portion 330 is positioned inside the end portion of the individual lead electrodes 91.

By providing the groove portion 330 in this way, it is possible to reduce the rigidity of the region of the vibration plate 50 which faces the pressure generation chamber 12 outside the active portion 320, that is, the so-called arm portion without changing the configuration of the vibration plate 50 immediately below the active portion 320. Therefore, the displacement characteristic of the piezoelectric actuator 300 can be improved, that is, a large displacement amount can be obtained with a low drive voltage.

In addition, by disposing the end portion of the groove portion 330 inside the end portion of the individual lead electrode 91 in the second direction Y, since a boundary of the groove portion 330 can be disposed on a portion in which the stacked structure of the vibration plate 50, the piezoelectric actuator 300, and the individual lead electrode 91 does not change, it is possible to gradually change the rigidity of the piezoelectric actuator 300 so that the stress concentration of the piezoelectric actuator 300 can be suppressed and the breakage of the piezoelectric actuator 300 can be suppressed.

In addition, in the second direction Y, by disposing the end portion of the groove portion 330 inside the end portion of the individual lead electrode 91, the first electrode 60 is not divided for each active portion 320 outside the groove portion 330 and the first electrode 60 can be continuous over the first direction X. Therefore, the first electrode 60 can be used as a common electrode of the plurality of active portions 320. In addition, in the second direction Y, since the first electrode 60 can be left wide outside the groove portion 330, the electric resistance of the first electrode 60 decreases, and the voltage drop can be suppressed in the first direction X of the first electrode 60 and the occurrence of a variation in the displacement amount of the active portion 320 can be suppressed.

In addition, in this embodiment, in the second direction Y, a dummy individual lead electrode 92 which is connected to the other end portion of the second electrode 80 on the side opposite to the one end portion to which the individual lead electrode 91 as the leading-out wiring is connected and which is a dummy leading-out wiring leaded out in the second direction Y is provided. As described above, by providing the dummy individual lead electrodes 92, it is possible to equalize the electric field strength and the rigidity of both end portions of the piezoelectric actuator 300 in the second direction Y so that the electric characteristics and the structural characteristics of the piezoelectric actuator 300 can be made symmetric in the second direction Y. Therefore, when the piezoelectric actuator 300 is displaced, the excessive deformation of only one end portion can be suppressed and the breakage thereof can be suppressed.

In addition, in this embodiment, in the second direction Y, since a dummy individual lead electrode 92 which is connected to the other end portion of the second electrode 80 on the side opposite to the one end portion to which the individual lead electrode 91 as the leading-out wiring is connected and which is a dummy leading-out wiring leaded out in the second direction Y is provided, the end portions of the groove portions 330 on the side of the dummy individual lead electrodes 92 are positioned inside the end portion of the dummy individual lead electrodes 92 in the second direction Y.

In this way, by disposing the end portion of the groove portion 330 inside the end portion of the dummy individual lead electrode 92 in the second direction Y, since the boundary of the groove portion 330 can be disposed on a portion in which change in the stacked structure of the vibration plate 50, the piezoelectric actuator 300 and the dummy individual lead electrode 92, the rigidity of the piezoelectric actuator 300 can be gradually changed even on a side of the dummy individual lead electrode 92 so that the stress concentration of the piezoelectric actuator 300 can be suppressed and the breakage of the piezoelectric actuator 300 can be suppressed.

In addition, on a side of the dummy individual lead electrode 92, the first electrode 60 can be continued over the first direction X without dividing the first electrode 60 for each active portion 320 outside the groove portion 330. In addition, in the second direction Y, since the first electrode 60 can be left wide outside the groove portion 330, the electric resistance of the first electrode 60 decreases, and in the first direction X of the first electrode 60, the voltage drop can be further suppressed and the occurrence of the variation in the displacement amount of the active portion 320 can be further suppressed.

In addition, in this embodiment, on the side opposite to the active portion 320 of the dummy individual lead electrode 92 as a dummy leading-out wiring in the second direction Y, the common lead electrode 93 as a leading-out wiring leaded out from the first electrode 60 are provided.

As illustrated above, by providing the common lead electrode 93, it is possible to easily lead out the wiring from the first electrode 60. In addition, by providing the common lead electrode 93 continuously in the first direction X, the electric resistance of the first electrode 60 in the first direction X can decrease.

In addition, if the common lead electrode 93 is provided between the adjacent dummy individual lead electrodes 92 in the first direction X, in the second direction Y, the first electrode 60 and the common lead electrode 93 can be connected without interfering with the dummy individual lead electrodes 92. Therefore, in the second direction Y, the width of the first electrode 60 can be narrowed and the position where the first electrode 60 and the common lead electrode 93 are connected can be brought closer to the active portion 320, and the electric resistance of the first electrode 60 can decrease.

In addition, in this embodiment, in the first direction X, an end portion of a side of the flow path forming substrate 10 in the third direction Z, as at least the stacked direction of the groove portion 330 is provided to be more closer to the inside of the pressure generation chamber 12 than a side of the end portion of the vibration plate 50 of the pressure generation chamber 12.

As described above, by providing the groove portion 330, rigidity of the region facing the pressure generation chamber 12 on the outside of the active portion 320 of the vibration plate 50, that is, a so-called arm portion can decrease without changing the configuration of the vibration plate 50 immediately below the active portion 320. Therefore, the displacement characteristic of the piezoelectric actuator 300 can be improved, that is, a large displacement amount can be obtained with a low drive voltage.

In addition, in this embodiment, in the second direction Y, the end portion of the pressure generation chamber 12 is positioned between the piezoelectric layer 70 and the second electrode 80. In other words, in the second direction Y, the piezoelectric layer 70 is provided so as to straddle the boundary between the flexible portion facing the pressure generation chamber 12 of the vibration plate 50 and the non-flexible portion not facing the pressure generation chamber 12. Accordingly, the rigidity of the boundary between the flexible portion and the non-flexible portion of the vibration plate 50 is improved, and breakage due to stress concentration at the boundary can be suppressed. In the second direction Y, the position of the end portion of the pressure generation chamber 12 is not limited thereto and, for example, the end portion of the pressure generation chamber 12 may be positioned outside the end portion of the piezoelectric layer 70.

In addition, in this embodiment, in the inside surface of the groove portion 330, the end surface of the piezoelectric layer 70, the end surface of the first electrode 60, the end surface of the vibration plate 50 from which a portion of the third direction Z, as the stacked direction, is removed, are provided so as to be flush with one another. In other words, the groove portion 330 is formed by collectively etching a portion of the piezoelectric layer 70, the first electrode 60, and the vibration plate 50. Accordingly, positioning between the end surface of the piezoelectric layer 70 forming the groove portion 330, the end surface of the first electrode 60 and the end surface of the portion of the vibration plate 50 removed by etching is performed with high accuracy, and the groove portion 330 can be accurately positioned can be formed.

Embodiment 2

Figure 11:
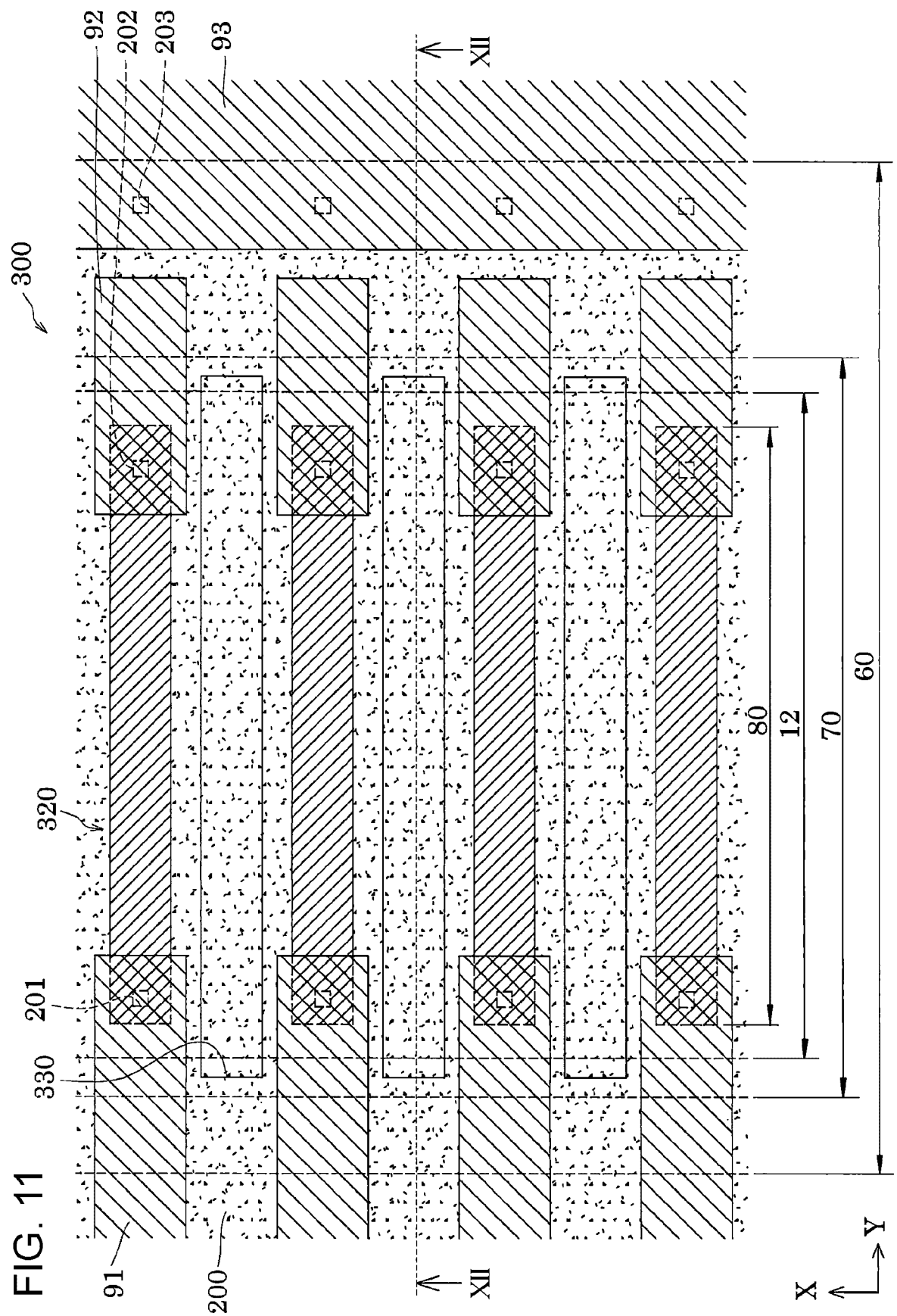
FIG. 11 is a plan view of a main portion illustrating a flow path forming substrate according to Embodiment 2 of the invention.
Figure 12:
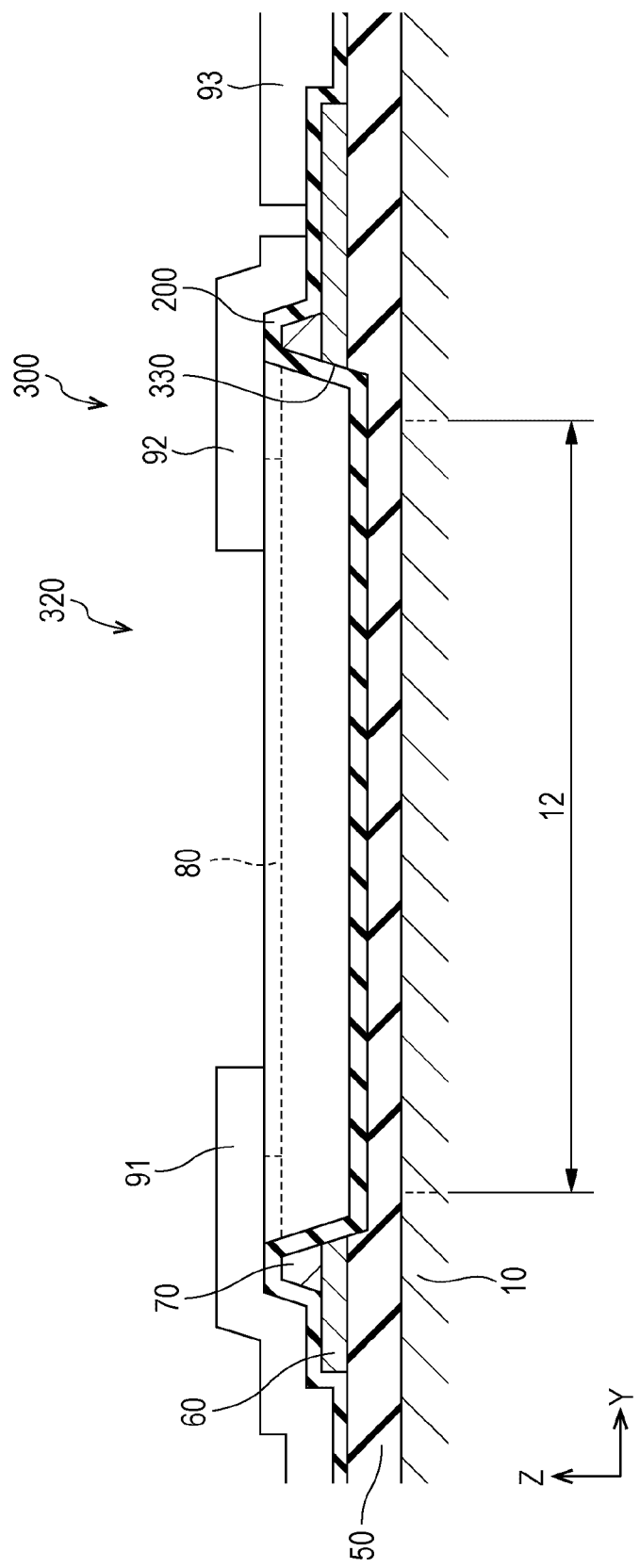
FIG. 12 is a sectional view illustrating a main portion of a recording head according to Embodiment 2 of the invention.

FIG. 11 is a plan view of a main portion of an ink jet type recording head as an example of a liquid ejecting head according to Embodiment 2 of the invention, and FIG. 12 is a sectional view taken along the line XII-XII of FIG. 11. The same reference numerals are given to the same members as those in the embodiment described above, and redundant description is omitted.

As illustrated in the drawing, in the piezoelectric actuator 300 of the recording head 1 as an example of the liquid ejecting head of this embodiment, a groove portion 330 is provided between the active portions 320 adjacent to each other in the first direction X. In the second direction Y, an end portion of the groove portion 330 is disposed outside the end portion of the active portion 320.

Here, the end portion of the groove portion 330 is an end portion on a side of the flow path forming substrate 10 in the third direction Z as in Embodiment 1 described above.

The end portion of the active portion 320 is an end portion of the second electrode 80 that defines the active portion 320. In addition, the end portion of the second electrode 80 is an end portion on a side of the flow path forming substrate 10 in the third direction Z. For example, even when the end surface of the second electrode 80 is an inclined surface inclined with respect to the third direction Z, the end portion of the inclined surface of the second electrode 80 on a side of the flow path forming substrate 10 may be positioned to be closer to the inside than the end portion of the groove portion 330.

The fact that end portion of the groove portion 330 is provided outside the end portion of the active portion 320 means that the end portion of the groove portion 330 is provided on the side opposite to the second electrode 80, that is, is provided until reaching the side where the second electrode 80 is not provided.

In addition, the end portion of the groove portion 330 does not include in the outside of the end portion of the active portion 320 that the end portion of the groove portion 330 and the end portion of the active portion 320 (end portion of second electrode 80) are provided at the same position in the second direction Y. In other words, the fact the end portion of the groove portion 330 is positioned outside the end portion of the active portion 320 means that a gap is provided between the end portion of the groove portion 330 and the end portion of the individual lead electrode 91 in the second direction Y.

The groove portion 330 is provided outside the end portion of the active portion 320 at both end portions in the second direction Y.

In addition, in this embodiment, the end portion of the groove portion 330 in the second direction Y is provided inside the end portion of the first electrode 60 and further inside the end portion of the piezoelectric layer 70.

Here, the end portion of the first electrode 60 is the end portion on a side the flow path forming substrate 10 in the third direction Z. For example, even when the end surface of the piezoelectric layer 70 is an inclined surface inclined with respect to the third direction Z, the end portion of the groove portion 330 on the side of the flow path forming substrate 10 may be positioned inside the end portion of the inclined surface of the piezoelectric layer 70 on a side of the flow path forming substrate 10, and those which are arranged in the opposite arrangement are included in other portions.

In addition, the end portion of the piezoelectric layer 70 is the end portion on a side of the flow path forming substrate 10 in the third direction Z. For example, even when the end surface of the piezoelectric layer 70 is an inclined surface inclined with respect to the third direction Z, the end portion of the groove portion 330 on the side of the flow path forming substrate 10 may be positioned inside the end portion of the inclined surface of the piezoelectric layer 70 on a side of the flow path forming substrate 10, and those which are arranged in the opposite arrangement are included in other portions.

In addition, in this embodiment, in the second direction Y, the end portion of the groove portion 330 is disposed outside the end portion of the pressure generation chamber 12.

Here, the end portion of the pressure generation chamber 12 is the end portion of the pressure generation chamber 12 on a side of the vibration plate 50 in the third direction Z. For example, even if the end surface of the pressure generation chamber 12 is an inclined surface inclined with respect to the third direction Z, the end portion of the groove portion 330 may be positioned outside the end portion of the inclined surface of the pressure generation chamber 12 on a side of the vibration plate 50, and those which are arranged in the opposite arrangement are included in other portions.

The end portion of the groove portion 330 in the first direction X is formed with a width narrower than the widths of the second electrodes 80 adjacent to each other in the first direction X as in Embodiment 1 described above.

As described above, in the recording head 1 as an example of the liquid ejecting head of this embodiment, the flow path forming substrate 10 in which a plurality of pressure generation chambers 12 communicating with the nozzles 21 are arranged in parallel in the first direction X, and the piezoelectric actuator 300 which has the first electrode 60 provided on one surface side of the flow path forming substrate 10 through the vibration plate 50, the piezoelectric layer 70 provided on the first electrode 60, and the second electrode 80 provided on the piezoelectric layer 70, the piezoelectric actuator 300 is provided with the active portion 320 obtained by inserting the first electrode 60 and the second electrode 80 of the piezoelectric layer 70 for each pressure generation chamber 12, the first electrode 60 constitutes a common electrode commonly provided to the plurality of active portions 320 and the second electrode 80 constitutes individual electrodes independently provided for each of the active portions 320, the end portion of the first electrode 60 is provided outside the end portion of the second electrode 80 in the second direction Y which is the in-plane direction of one surface of the flow path forming substrate 10 and is orthogonal to the first direction X, and the end portion of the piezoelectric layer 70 is provided between the end portion of the first electrode 60 and the end portion of the second electrode 80, and in the second direction Y, the individual lead electrodes 91 as a leading-out wiring leaded out in the second direction Y from one end portion of the second electrode 80 is provided, between the active portions 320 which are adjacent to each other in the first direction X, the groove portion 330 which is provided in the third direction Z as a stacked direction of the second electrode 80, the piezoelectric layer 70, the first electrode 60, and the vibration plate 50, and, in the second direction Y, the end portion of the groove portion 330 is positioned outside the end portion of the active portion 320.

By providing the groove portion 330 in this way, it is possible to reduce the rigidity of the region of the vibration plate 50 which faces the pressure generation chamber 12 outside the active portion 320, that is, the so-called arm portion without changing the configuration of the vibration plate 50 immediately below the active portion 320. Therefore, the displacement characteristic of the piezoelectric actuator 300 can be improved, that is, a large displacement amount can be obtained with a low drive voltage.

In addition, by disposing the end portion of the groove portion 330 outside the end portion of the active portion 320 in the second direction Y, in the region where the effective electric field is low outside the active portion 320 of the piezoelectric actuator 300, it is possible to dispose a boundary between a portion with high rigidity where the groove portion 330 is not formed and a portion with low rigidity in which the groove portion 330 is formed. Therefore, it becomes difficult to deform the boundary where the rigidity largely changes depending on the presence or absence of the formation of the groove portion 330, and it is possible to suppress concentration of stress on this boundary.

In addition, in this embodiment, in the second direction Y, the end portion of the groove portion 330 is positioned inside the end portion of the piezoelectric layer 70. As illustrated above, by disposing the end portion of the groove portion 330 inside the piezoelectric layer 70, the first electrode 60 is not divided for each active portion 320 outside the groove portion 330, so that the first electrode 60 can be made continuous in the first direction X. Therefore, the first electrode 60 can be used as a common electrode of the plurality of active portions 320. In addition, by disposing the end portion of the groove portion 330 inside the end portion of the piezoelectric layer 70, the first electrode 60 can be left to be wide outside the groove portion 330, so that the electric resistance of the first electrode 60 decrease, and it is possible to suppress the voltage drop in the first direction X of the first electrode 60 and suppress the variation in the displacement amount of the active portion 320.

In this embodiment, in the second direction Y, the end portion of the groove portion 330 is disposed inside the end portion of the piezoelectric layer 70, but the invention is not particularly limited thereto. For example, in the second direction Y, the end portion of the groove portion 330 may be positioned inside the end portion of the first electrode 60. As described above, when the end portion of the groove portion 330 is disposed inside the end portion of the first electrode 60, the first electrode 60 is not divided for each active portion 320 outside the groove portion 330, and the first direction The first electrode 60 can be continued over X, and the first electrode 60 can be used as a common electrode of the plurality of active portions 320.

In addition, in this embodiment, in the second direction Y, the end portion of the groove portion 330 is positioned outside the end portion of the pressure generation chamber 12. As illustrated above, by providing the end portion which becomes the boundary where the rigidity greatly changes by the groove portion 330 in a portion, which is not displaced, outside the pressure generation chamber 12, it is possible to suppress concentration of stress at the end portion of the groove portion 330, breakage can be suppressed. Of course, the invention is not limited to this, and the end portion of the groove portion 330 may be positioned inside the end portion of the pressure generation chamber 12 in the second direction Y.

In the piezoelectric actuator 300 of this embodiment, dummy individual lead electrodes 92 and common lead electrodes 93 are provided.

Embodiment 3

Figure 13:
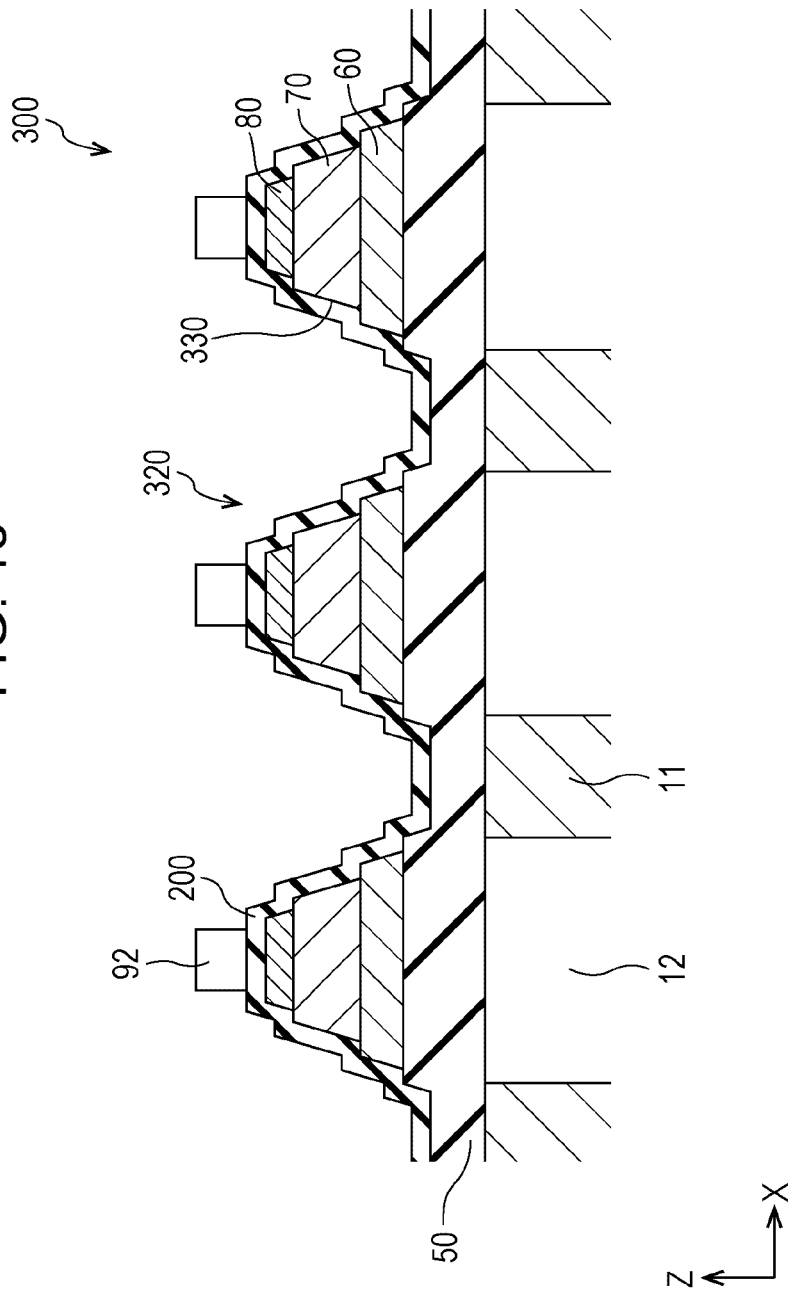
FIG. 13 is a sectional view illustrating the main portion of the recording head according to Embodiment 3 of the invention.

FIG. 13 is a sectional view of a main portion of an ink jet type recording head as an example of a liquid ejecting head according to Embodiment 3 of the invention. The same reference numerals are given to the same members as those in the embodiments described above, and redundant description is omitted.

As illustrated in FIG. 13, on the inner surface of the groove portion 330 of the recording head 1, in the first direction X, as an example of the liquid ejecting head of this embodiment, a step is formed between the end surface of the piezoelectric layer 70, the end surface of the first electrode 60, and the end surface of the vibration plate 50 from which a portion thereof in the stacked direction is removed. In other words, the end surface of the piezoelectric layer 70 and the end surface of the first electrode 60 are not provided flush with one another. In this embodiment, a step is formed such that the opening of the groove portion 330 widens stepwise from a side of the vibration plate 50 toward a side of the piezoelectric layer 70.

Such a groove portion 330 can be formed by dividing and etching the piezoelectric layer 70, the first electrode 60, and the vibration plate 50. Here, the process of forming the groove portion 330 will be described with reference to FIGS. 14 to 17. FIGS. 14 to 18 are sectional views illustrating a method for manufacturing the recording head.

Figure 14:
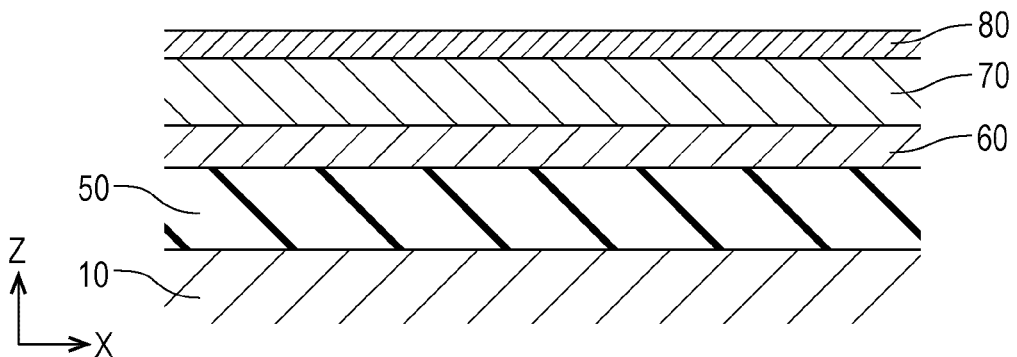
FIG. 14 is a sectional view illustrating a method for manufacturing a recording head according to Embodiment 3 of the invention.

As illustrated in FIG. 14, the vibration plate 50, the first electrode 60, the piezoelectric layer 70, and the second electrode 80 are stacked on the flow path forming substrate 10.

Figure 15:
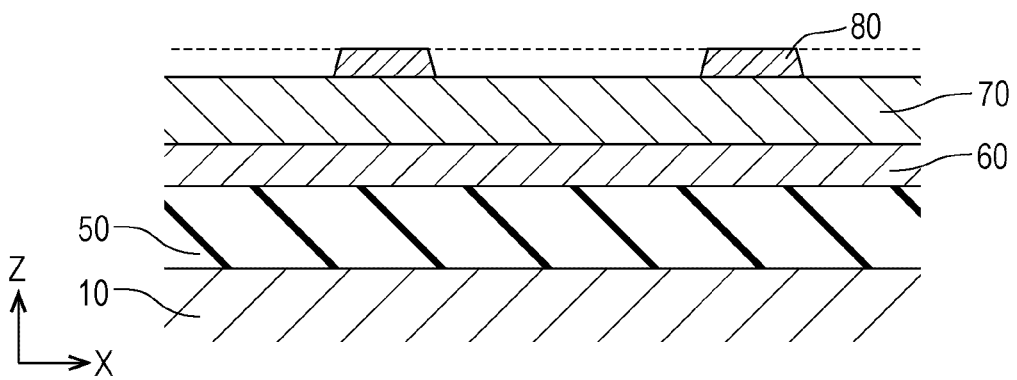
FIG. 15 is a sectional view illustrating the method for manufacturing a recording head according to Embodiment 3 of the invention.

Next, as illustrated in FIG. 15, the second electrode 80 is etched and patterned into a predetermined shape.

Figure 16:
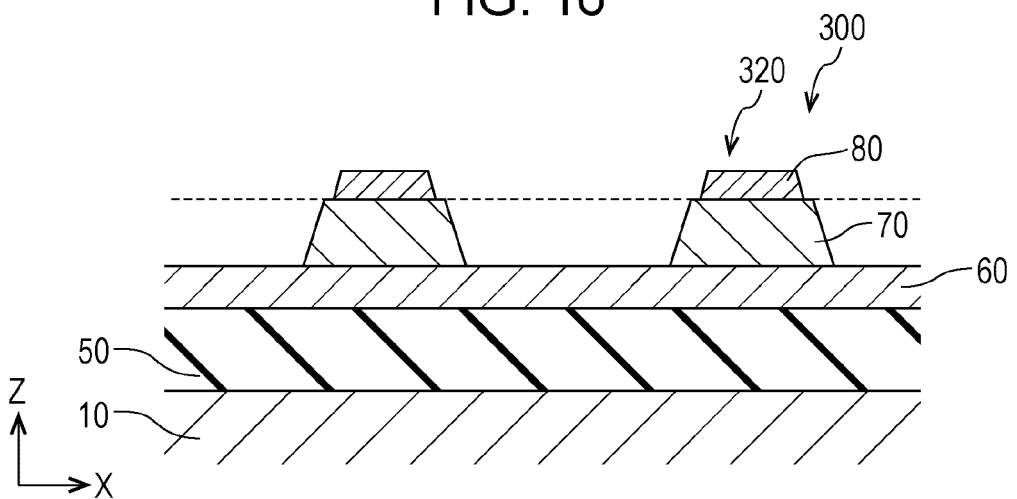
FIG. 16 is a sectional view illustrating the method for manufacturing a recording head according to Embodiment 3 of the invention.

Next, as illustrated in FIG. 16, the piezoelectric layer 70 is etched and patterned into a predetermined shape. At this time, a portion of the piezoelectric layer 70 is removed to form a portion of the groove portion 330.

Figure 17:
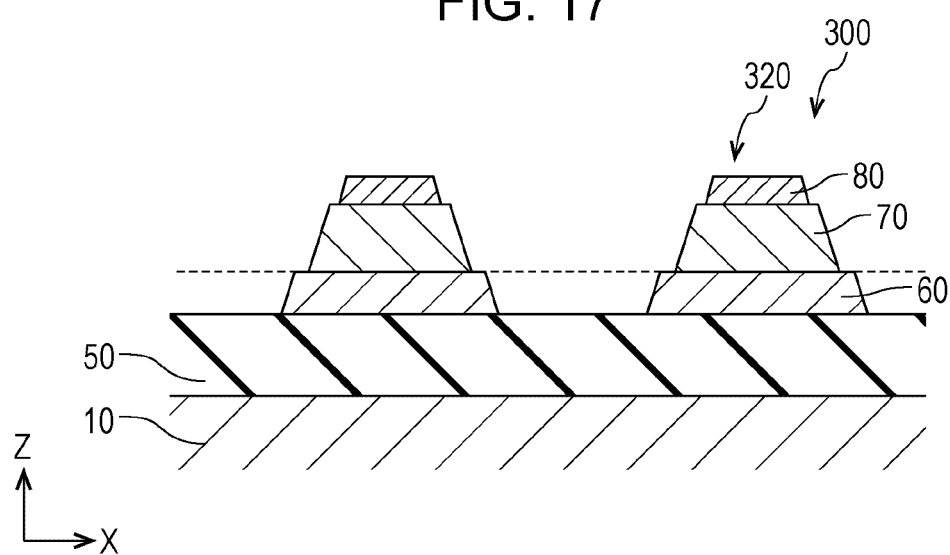
FIG. 17 is a sectional view illustrating the method for manufacturing a recording head according to Embodiment 3 of the invention.

Next, as illustrated in FIG. 17, the first electrode 60 is etched to be patterned into a predetermined shape. At this time, a portion of the first electrode 60 is removed to form a portion of the groove portion 330.

Figure 18:
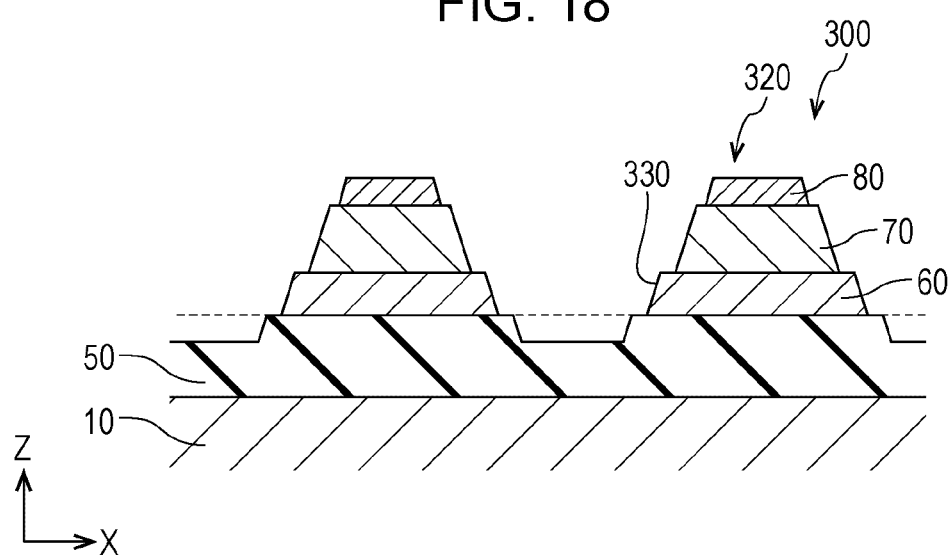
FIG. 18 is a sectional view illustrating the method for manufacturing a recording head according to Embodiment 3 of the invention.

Next, as illustrated in FIG. 18, a portion of the vibration plate 50 in the third direction Z as the stacked direction thereof is removed by etching, thereby forming the groove portion 330.

As illustrated above, by etching the piezoelectric layer 70, etching the first electrode 60, and etching the vibration plate 50 in different steps to form the groove portion 330, on the inner surface of the groove portion 330 in the first direction X, a step is formed between the end surface of the piezoelectric layer 70, the end surface of the first electrode 60, and the end surface of the vibration plate 50 from which a portion thereof in the third direction Z as the stacked direction is removed. In other words, if the etching process is different, it is difficult to position the end surface of the piezoelectric layer 70, the end surface of the first electrode 60, and the end surface of the removed portion of the vibration plate 50 to be flush one another with high precision. Therefore, in the inner surface of the groove portion 330 in the first direction X, between the end surface of the piezoelectric layer 70, the end surface of the first electrode 60, and the end surface of the vibration plate 50 from which a portion thereof in the third direction Z as the stacked direction is removed, a step is formed.

As described above, in the recording head 1, as an example of the liquid ejecting head of this embodiment, on the inner surface of the groove portion 330, a step is formed between the end surface of the piezoelectric layer 70, the end surface of the first electrode 60, and the end surface of the vibration plate 50 from which a portion thereof in the third direction Z as the stacked direction is removed. Even if a step is formed on the side surface of the groove portion 330 as described above, the rigidity of the arm portion of the vibration plate 50 can decrease by the groove portion 330, and the displacement characteristic of the piezoelectric actuator 300 can be improved.

In this embodiment, on the inner surface of the groove portion 330, although steps are provided two place which are between the end surface of the vibration plate 50 and the end surface of the first electrode 60 and between the end surface of the first electrode 60 and the end surface of the piezoelectric layer 70, the invention is not limited to this, but either one may be flush. In other words, by simultaneously etching the vibration plate 50 and the first electrode 60, the end surface of the vibration plate 50 and the end surface of the first electrode 60 can be flush one another on the inner surface of the groove portion 330. In addition, by simultaneously etching the piezoelectric layer 70 and the first electrode 60, the end surface of the piezoelectric layer 70 and the end surface of the first electrode 60 can be flush one another on the inner surface of the groove portion 330.

In addition, the etching of the first electrode 60 may be performed before the piezoelectric layer 70 and the like are formed. Similarly, the piezoelectric layer 70 may be etched before the second electrode 80 is formed.

Embodiment 4

Figure 19:
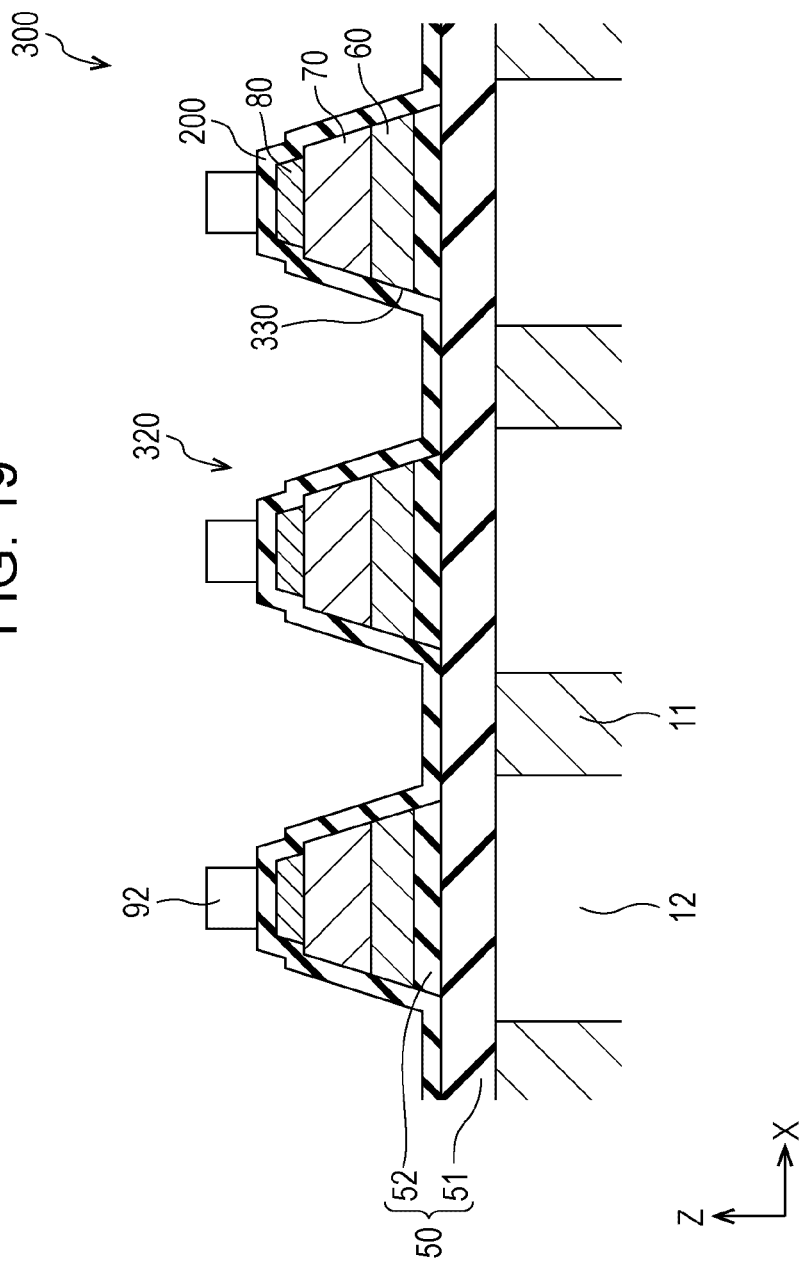
FIG. 19 is a sectional view illustrating a main portion of a recording head according to Embodiment 4 of the invention.

FIG. 19 is a sectional view of a main portion of an ink jet type recording head as an example of a liquid ejecting head according to Embodiment 4 of the invention. The same reference numerals are given to the same members as those in the embodiment described above, and redundant description is omitted.

As illustrated in FIG. 19, the vibration plate 50 of the recording head 1, as an example of the liquid ejecting head of this embodiment, includes a first vibration plate 51 and a second vibration plate 52.

The first vibration plate 51 is provided on a side of the flow path forming substrate 10. In addition, the second vibration plate 52 is provided on a side of the piezoelectric actuator 300.

The first vibration plate 51 and the second vibration plate 52 are made of a material different in an etching selection ratio. Here, the difference in the etching selection ratio means that when the second vibration plate 52 is subjected to wet etching or reactive ion etching (RIE), the etching selection ratio of the second vibration plate 52 to the first vibration plate 51 is greater than 1. In other words, when wet etching or reactive ion etching (RIE) is performed on the second vibration plate 52, the etching rate of the first vibration plate 51 may be lower than the etching rate of the second vibration plate 52.

In this embodiment, the groove portion 330 has a depth reaching a layer boundary of a material different in an etching selection ratio, that is, a side surface on the bottom surface side of the groove portion 330 is formed by an end surface of the second vibration plate 52, and the bottom surface of the groove portion 330 is formed by the first vibration plate 51. In other words, when forming the groove portion 330 by etching the vibration plate 50 from the side opposite to the flow path forming substrate 10, the layer boundary of the materials different in an etching selection ratio, that is, the etching can be stopped at the boundary between the first vibration plate 51 and the second vibration plate 52.

Examples of the material of the first vibration plate 51 and the second vibration plate 52 are silicon oxide, zirconium oxide, silicon nitride, polysilicon, titanium oxide, and the like. For example, by using zirconium oxide having substantially the same etching rate as that of the piezoelectric layer 70 which is lead titanate zirconate (PZT) as the second vibration plate 52, the piezoelectric layer 70 and the second vibration plate 52 can be simultaneously etched by etching. By using silicon oxide as the first vibration plate 51, for example, the first vibration plate 51 can function as an etching stop layer when the second vibration plate 52 is etched, and the flow path forming substrate 10 can function as an etching stop layer when performing anisotropic etching from the surface side to which the nozzle plate 20 is joined.

As described above, in the vibration plate 50 of the recording head 1, as an example of the liquid ejecting head of this embodiment, in the third direction Z as the stacked direction of the flow path forming substrate 10 and the piezoelectric actuator 300, materials different in etching selection ratios are different from each other are stacked and the bottom surface of the groove portion 330 is the layer boundary of the vibration plate 50. As described above, by forming the vibration plate 50 having a stacked structure different in an etching selection ratio, etching can be stopped at the layer boundary of the vibration plate 50 when the groove portion 330 is formed by etching, so the depth of the groove portion 330 can be controlled with high precision. Therefore, it is possible to suppress variations in the depth of the groove portion 330 and to suppress variations in the displacement of the piezoelectric actuator 300 by occurring variations in the depth of the groove portion 330.

Another Embodiment

Although the embodiments of the invention have been described above, the invention is not limited to the embodiments described above.

For example, in each of the embodiments described above, the dummy individual lead electrodes 92 are provided, but the invention is not limited thereto, and the dummy individual lead electrodes 92 may not be provided.

In addition, in each of the embodiments described above, the configuration in which the piezoelectric layer 70 is provided over the first electrode 60 and the second electrode 80 is provided over the piezoelectric layer 70 has been exemplified, but, another member may be provided between the first electrode 60 and the piezoelectric layer 70 or between the piezoelectric layer 70 and the second electrode 80. In other words, a state where another member is interposed on the first electrode 60 and the piezoelectric layer 70, just above the first electrode 60 and the piezoelectric layer 70, and therebetween is included.

In addition, in each of the embodiments described above, the flow path forming substrate 10 and the nozzle plate 20 are directly stacked, but, the invention is not particularly limited thereto, and a communication plate or the like having a nozzle communication path which communicates the pressure generation chamber 12 and the nozzle 21 between the flow path forming substrate 10 and the nozzle plate 20 may be provided. In addition, the communication plate may be provided with a flow path communicating toward the upstream side in the pressure generation chamber 12. In addition, the flow path forming substrate 10 may be provided with the communication portion 13, the ink supply path 14, the communication path 15, or the like.

Figure 20:
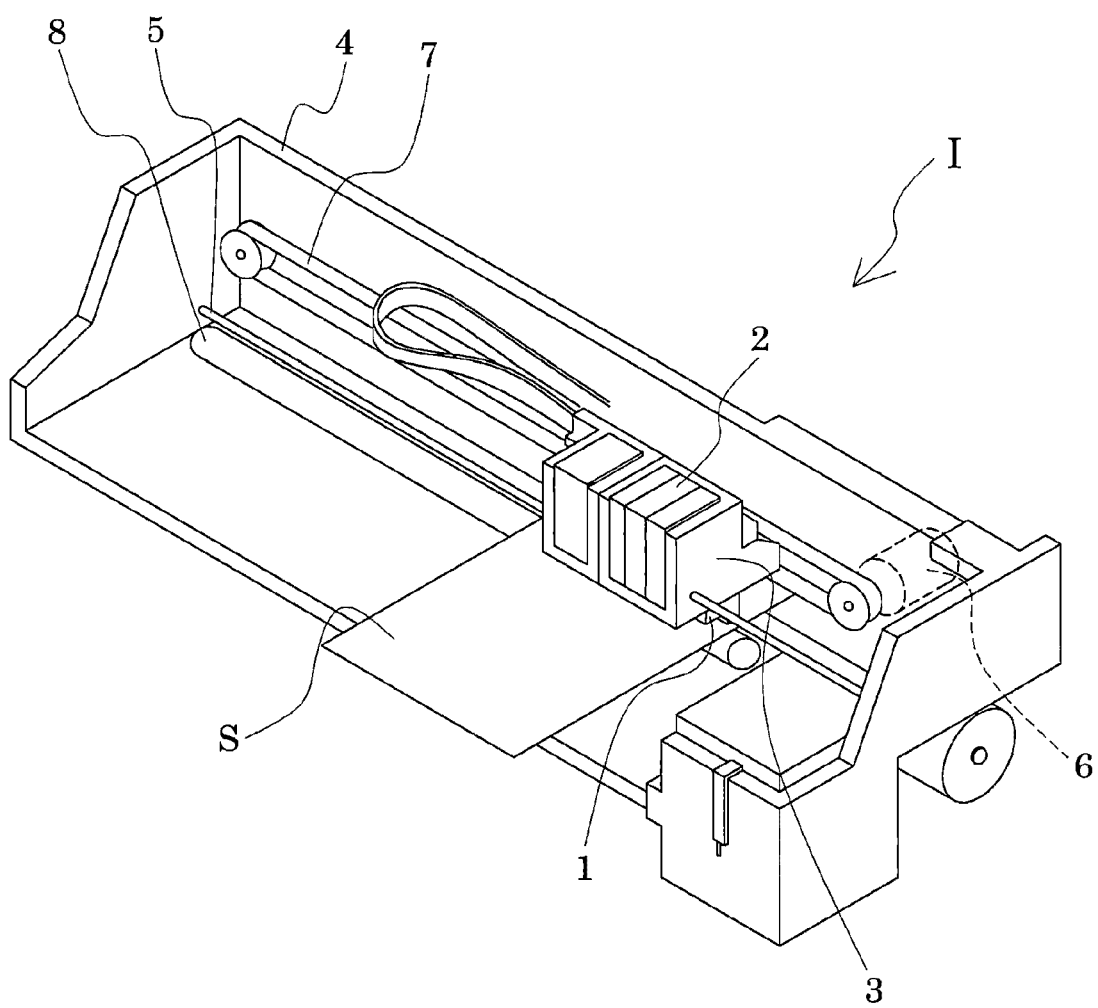
FIG. 20 is a diagram illustrating a schematic configuration of a recording apparatus according to an embodiment of the invention.

In addition, the recording head 1 of each of these embodiments is mounted on an ink jet type recording apparatus. FIG. 20 is a schematic diagram illustrating an example of the ink jet type recording apparatus.

In the ink jet type recording apparatus I illustrated in FIG. 20, the recording head 1 is detachably provided with an ink cartridge 2 constituting storage means, and a carriage 3 on which the recording head 1 is mounted is provided to be movable in the axial direction on the carriage shaft 5 attached to the apparatus main body 4.

Then, the driving force of a driving motor 6 is transmitted to the carriage 3 through a plurality of gears (not illustrated) and the timing belt 7, whereby the carriage 3 on which the recording head 1 is mounted is moved along the carriage shaft 5. On the other hand, an apparatus main body 4 is provided with a transport roller 8 as a transport section, and a recording sheet S as a recording medium such as paper is transported by a transport roller 8. The transport section for transporting the recording sheet S is not limited to the transport roller, but may be a belt, a drum or the like.

In the ink jet type recording apparatus I described above, the recording head 1 is mounted on the carriage 3 and moves in the main scanning direction, but, the invention is not limited thereto, and for example, when the recording head 1 is fixed, The invention can also be applied to a so-called line type recording apparatus which performs printing by merely moving the recording sheet S such as paper in the sub-scanning direction.

In addition, in the example described above, the ink jet type recording apparatus I has a configuration in which the ink cartridge 2 as the liquid storing section is mounted on the carriage 3, but the invention is not particularly limited thereto, and for example, a liquid storing section such as an ink tank may be fixed to the apparatus main body 4 and the storage section and the recording head 1 may be connected through a supply pipe such as a tube. In addition, the liquid storage means may not be mounted on the ink jet type recording apparatus.

In each of the embodiments described above, an ink jet type recording head has been described as an example of a liquid ejecting head, but the invention is broadly applied to a liquid ejecting head in general, and, naturally, the invention can also be applied to a liquid ejecting head for ejecting liquid other than ink. Examples of other liquid ejecting heads include various recording heads used in image recording apparatuses such as printers, color material ejecting heads used for manufacturing color filters such as liquid crystal displays, organic EL displays, an electrode material ejecting head used for forming an electrode such as field emission displays (FEDs), a bioorganic material ejecting head used for manufacturing a biochip, and the like.

In addition, the invention is not limited to a piezoelectric device used for a liquid ejecting head, and can be applied to other piezoelectric devices having a substrate on which a recessed portion is formed and a piezoelectric actuator which is provided on one side of the substrate with a vibration plate interposed therebetween can be used. Other piezoelectric devices include, for example, an ultrasonic device such as an ultrasonic transmitter, an ultrasonic motor, a temperature-electric converter, a pressure-electric converter, a ferroelectric transistor, a piezoelectric transformer, a blocking filter for harmful light such as infrared ray, an optical filter using photonic crystal effect by quantum dot formation, a filter such as an optical filter utilizing optical interference of the thin film, an infrared sensor, various sensors such as an ultrasonic sensor, a thermal sensor, a pressure sensor, a pyroelectric sensor, and a gyroscopic sensor (angular velocity sensor), ferroelectric memories, and the like.

What is claimed is:

1. A liquid ejecting head comprising:
   a flow path forming substrate in which a plurality of pressure generation chambers communicating with nozzles are arranged in parallel in a first direction; and
   a piezoelectric actuator which has a first electrode provided on one surface side of the flow path forming substrate with a vibration plate interposed therebetween, a piezoelectric layer provided on the first electrode, and a second electrode provided on the piezoelectric layer,
   wherein, in the piezoelectric actuator, an active portion which is obtained by inserting the first electrode and the second electrode of the piezoelectric layer is provided for each pressure generation chamber,
   wherein the first electrode constitutes common electrodes which are provided commonly to a plurality of the active portions,
   wherein the second electrode constitutes an individual electrode independently provided for each of the active portions,
   wherein, in a second direction orthogonal to the first direction as an in-plane direction of the one surface of the flow path forming substrate, an end portion of the first electrode is provided outside an end portion of the second electrode, an end portion of the piezoelectric layer is provided between the end portion of the first electrode and the end portion of the second electrode,
   wherein, in the second direction, a leading-out wiring leaded out in the second direction from one end portion of the second electrode is provided,
   wherein, between the active portions adjacent to each other in the first direction, a groove portion is provided which is provided over the second electrode, the piezoelectric layer, the first electrode, and a portion of the vibration plate in a stacked direction,
   wherein, in the second direction, the end portion of the groove portion is positioned inside an end portion of the leading-out wiring, and
   wherein, in the second direction, a dummy leading-out wiring is provided which is connected to the other end portion of the second electrode on a side opposite to the one end portion to which the leading-out wiring is connected, and is leaded out in the second direction.

2. A liquid ejecting head comprising:
a flow path forming substrate in which a plurality of pressure generation chambers communicating with nozzles are arranged in parallel in a first direction; and
a piezoelectric actuator which has a first electrode provided on one surface side of the flow path forming substrate with a vibration plate interposed therebetween, a piezoelectric layer provided on the first electrode, and a second electrode provided on the piezoelectric layer,
wherein, in the piezoelectric actuator, an active portion which is obtained by inserting the first electrode and the second electrode of the piezoelectric layer is provided for each pressure generation chamber,
wherein the first electrode constitutes common electrodes which are provided commonly to a plurality of the active portions,
wherein the second electrode constitutes an individual electrode independently provided for each of the active portions,
wherein, in a second direction orthogonal to the first direction as an in-plane direction of the one surface of the flow path forming substrate, an end portion of the first electrode is provided outside an end portion of the second electrode, and an end portion of the piezoelectric layer is provided between the end portion of the first electrode and the end portion of the second electrode,
wherein, in the second direction, a leading-out wiring leaded out from one end portion of the second electrode in the second direction is provided,
wherein, between the active portions adjacent to each other in the first direction, a groove portion is provided which is provided over the second electrode, the piezoelectric layer, the first electrode, and a portion of the vibration plate in a stacked direction, and
wherein in the second direction, the end portion of the groove portion is positioned outside an end portion of the active portion.

3. The liquid ejecting head of claim 1,
wherein, in the second direction, the end portion of the groove portion is positioned inside the end portion of the first electrode.

4. The liquid ejecting head of claim 1,
wherein, in the second direction, the end portion of the groove portion is positioned inside the end portion of the piezoelectric layer.

5. The liquid ejecting head of claim 2,
wherein, in the second direction, the end portion of the groove portion is positioned outside the end portion of the pressure generation chamber.

6. The liquid ejecting head of claim 1,
wherein, in the second direction, and an end portion of the groove portion on a side of the dummy leading-out wiring is positioned inside the end portion of the dummy leading-out wiring.

7. The liquid ejecting head of claim 1,
wherein, in the second direction, the leading-out wiring leaded out from the first electrode is provided on a side opposite to the active portion of the dummy leading-out wiring.

8. The liquid ejecting head of claim 1,
wherein, in the first direction, an end portion of the groove portion at least on a side of the flow path forming substrate in the stacked direction is provided inside the pressure generation chamber of an end portion of the pressure generation chamber on a side of the vibration plate.

9. The liquid ejecting head of claim 1,
wherein an end portion of the pressure generation chamber in the second direction is positioned between the piezoelectric layer and the second electrode.

10. The liquid ejecting head of claim 1,
wherein the vibration plate is configured by stacking materials different in an etching selection ratio in the stacked direction of the flow path forming substrate and the piezoelectric actuator, and
wherein a bottom surface of the groove portion is a layer boundary of the vibration plate.

11. The liquid ejecting head of claim 1,
wherein, on an inner surface of the groove portion, an end surface of the piezoelectric layer, an end surface of the first electrode, and an end surface of the vibration plate from which a portion in the stacked direction is removed are provided so as to be flush one another.

12. The liquid ejecting head of claim 1,
wherein, on an inner surface of the groove portion, a step is formed between an end surface of the piezoelectric layer, an end surface of the first electrode, and an end surface of the vibration plate from which a portion in the stacked direction is removed.

13. A liquid ejecting apparatus comprising:
the liquid ejecting head according to claim 1.

14. A liquid ejecting apparatus comprising:
liquid ejecting head according to claim 2.

15. A liquid ejecting apparatus comprising:
liquid ejecting head according to claim 3.

16. A liquid ejecting apparatus comprising:
liquid ejecting head according to claim 4.

17. A liquid ejecting apparatus comprising:
liquid ejecting head according to claim 5.

18. A piezoelectric device comprising:
a substrate in which a plurality of recessed portions are arranged in parallel in a first direction; and
a piezoelectric actuator which has a first electrode provided on one surface side of the substrate with a vibration plate interposed therebetween, a piezoelectric layer provided on the first electrode, and a second electrode provided on the piezoelectric layer,
wherein, in the piezoelectric actuator, an active portion obtained by inserting the first electrode and the second electrode of the piezoelectric layer is provided for each recessed portion,
wherein the first electrode constitutes common electrodes which are provided commonly to a plurality of the active portions,
wherein the second electrode constitutes an individual electrode independently provided for each of the active portions,
wherein, in a second direction orthogonal to the first direction as an in-plane direction of the one surface of the substrate, an end portion of the first electrode is provided outside an end portion of the second electrode, an end portion of the piezoelectric layer is provided between the end portion of the first electrode and the end portion of the second electrode,
wherein, in the second direction, a leading-out wiring leaded out in the second direction from one end portion of the second electrode is provided,
wherein between the active portions adjacent to each other in the first direction, a groove portion provided over the second electrode, the piezoelectric layer, the first electrode, and a portion of the vibration plate in the stacked direction is provided, wherein, in the second direction, the end portion of the groove portion is positioned inside the end portion of the leading-out wiring, and wherein, in the second direction, a dummy leading-out wiring is provided which is connected to the other end portion of the second electrode on a side opposite to the one end portion to which the leading-out wiring is connected, and is leaded out in the second direction.

19. A piezoelectric device comprising:

a substrate in which a plurality of recessed portions are arranged in parallel in a first direction; and a piezoelectric actuator which has a first electrode provided on one surface side of the substrate with a vibration plate interposed therebetween, a piezoelectric layer provided on the first electrode, and a second electrode provided on the piezoelectric layer, wherein, in the piezoelectric actuator, an active portion obtained by inserting the first electrode and the second electrode of the piezoelectric layer is provided for each recessed portion, wherein the first electrode constitutes common electrodes which are provided commonly to a plurality of the active portions, wherein the second electrode constitutes an individual electrode independently provided for each of the active portions, wherein, in a second direction orthogonal to the first direction as an in-plane direction of the one surface of the substrate, an end portion of the first electrode is provided outside an end portion of the second electrode, and an end portion of the piezoelectric layer is provided between the end portion of the first electrode and the end portion of the second electrode, wherein, in the second direction, a leading-out wiring leaded out in the second direction from one end portion of the second electrode is provided, wherein, between the active portions adjacent to each other in the first direction, a groove portion provided over the second electrode, the piezoelectric layer, the first electrode, and a portion of the vibration plate in the stacked direction is provided, and wherein, in the second direction, an end portion of the groove portion is positioned outside an end portion of the active portion.

\* \* \* \* \*